(12) United States Patent
Hunter

(10) Patent No.: US 12,399,207 B2
(45) Date of Patent: Aug. 26, 2025

(54) SYSTEM AND METHOD FOR DETECTING CABLE SYSTEM SIGNAL INGRESS

(71) Applicant: Charter Communications Operating, LLC, St. Louis, MO (US)

(72) Inventor: Patrick Phillip Hunter, Saint Charles, MO (US)

(73) Assignee: Charter Communications Operating, LLC, St. Louis, MO (US)

( * ) Notice: Subject to any disclaimer, the term of this patent is extended or adjusted under 35 U.S.C. 154(b) by 0 days.

(21) Appl. No.: 18/383,382

(22) Filed: Oct. 24, 2023

(65) Prior Publication Data

US 2024/0061032 A1 Feb. 22, 2024

Related U.S. Application Data

(63) Continuation of application No. 17/398,633, filed on Aug. 10, 2021, now Pat. No. 11,846,666.

(51) Int. Cl.
*G01R 31/12* (2020.01)
*G01R 31/08* (2020.01)
*G01R 31/52* (2020.01)

(52) U.S. Cl.
CPC ....... *G01R 31/1272* (2013.01); *G01R 31/083* (2013.01); *G01R 31/52* (2020.01)

(58) Field of Classification Search
CPC ... G01R 31/1272; G01R 31/083; G01R 31/52
See application file for complete search history.

(56) References Cited

U.S. PATENT DOCUMENTS

| 3,155,897 A | 11/1964 | Rice |
| 3,185,443 A | 5/1965 | Eitel |
| 3,831,086 A | 8/1974 | Pesto |
| 4,072,899 A * | 2/1978 | Shimp ............... G01R 31/083 |
| | | 348/192 |
| 4,886,980 A | 12/1989 | Fernandez |

(Continued)

FOREIGN PATENT DOCUMENTS

| CN | 102323331 | 1/2011 |
| CN | 112213668 | 1/2021 |

(Continued)

OTHER PUBLICATIONS

Hranac, Ron, "Tackling Serious Ingress, Communications Technology," May 2004.

*Primary Examiner* — Lee E Rodak
*Assistant Examiner* — Demetrius R Pretlow
(74) *Attorney, Agent, or Firm* — Brandon N. Sklar, Esq.

(57) ABSTRACT

An apparatus is disclosed to identify defects in a cable plant including a cable comprises a carriage and a roller attached to the carriage. The roller is configured to sit on a cable plant. A motor is attached to the carriage and is coupled to the roller to cause rotation of the roller in at least a first direction, to cause movement of the carriage across the cable plant. A transmitter is attached to the carriage and an antenna is coupled to the transmitter. The antenna is configured to emit an RF signal under the control of the transmitter. If there is a defect in the cable, the RF signal may enter the cable through a defect. Detection of the RF signal in the cable is indicative of the presence of a defect in the cable and the location of the defect. Methods and systems are also disclosed.

24 Claims, 15 Drawing Sheets

(56) References Cited

U.S. PATENT DOCUMENTS

| | | | |
|---|---|---|---|
| 5,777,662 A | | 7/1998 | Zimmerman |
| 6,062,542 A | | 5/2000 | Delaney |
| 6,805,333 B2 | | 10/2004 | Delaney |
| 9,991,651 B2 | | 6/2018 | Burris |
| 11,271,650 B1 | * | 3/2022 | Bonen ................ H04B 10/2575 |
| 2003/0033609 A1 | | 2/2003 | Zimmerman |
| 2004/0174309 A1 | | 9/2004 | Terreault |
| 2006/0248565 A1 | | 11/2006 | Shimp |
| 2012/0046799 A1 | | 2/2012 | Alex |
| 2014/0204197 A1 | | 7/2014 | Olsson |
| 2015/0077129 A1 | * | 3/2015 | Zinevich ................... G01S 5/06 |
| | | | 324/512 |
| 2016/0137101 A1 | | 5/2016 | Eckle |
| 2016/0173195 A1 | | 6/2016 | Nielsen |
| 2017/0019148 A1 | | 1/2017 | Williams |
| 2017/0077988 A1 | | 3/2017 | Flask |
| 2017/0141845 A1 | | 5/2017 | Totten |
| 2019/0107572 A1 | | 4/2019 | Williams |
| 2020/0011921 A1 | | 1/2020 | Jenny |
| 2021/0285841 A1 | | 9/2021 | Bouchard |
| 2021/0341548 A1 | | 11/2021 | Cencula |
| 2022/0294201 A1 | | 9/2022 | Bouchard |
| 2022/0294202 A1 | | 9/2022 | Bouchard |

FOREIGN PATENT DOCUMENTS

| | | | |
|---|---|---|---|
| CN | 112213668 A | * | 1/2021 |
| KR | 20030059762 | | 7/2003 |
| KR | 20030059762 A | * | 7/2003 |

\* cited by examiner

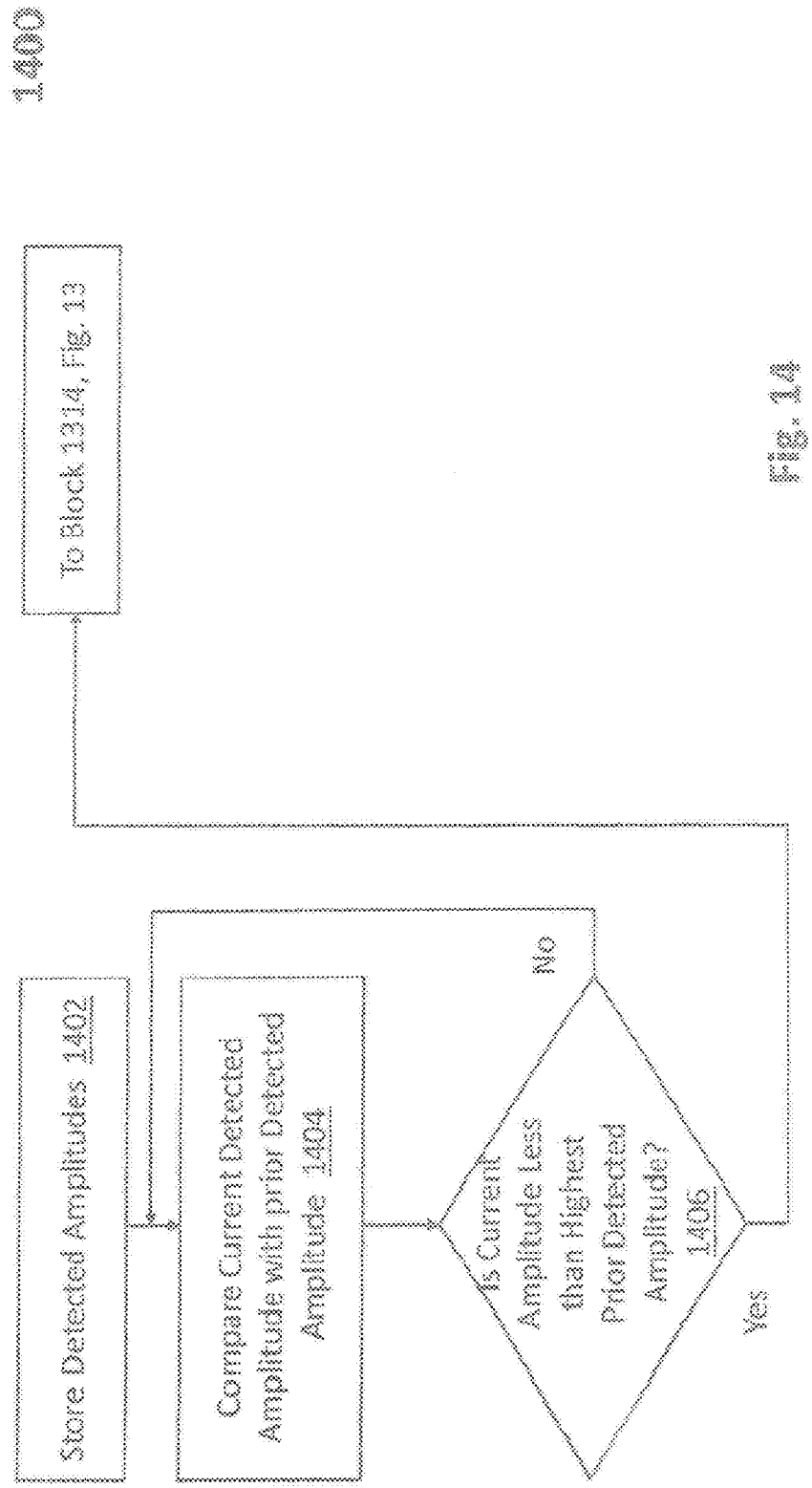

SYSTEM AND METHOD FOR DETECTING CABLE SYSTEM SIGNAL INGRESS

RELATED APPLICATION

The present application is a continuation of U.S. patent application Ser. No. 17/398,633, which was filed on Aug. 10, 2021, is assigned to the assignee of the present patent application, and is incorporated by reference herein.

FIELD OF THE INVENTION

Detecting cable system signal ingress, and, more particularly, detecting cable signal ingress by emitting an RF signal by a device that crawls along the cable and monitoring the signals carried by the cable for the emitted signal.

BACKGROUND OF THE INVENTION

The radio frequencies ("RF") used by cable television ("TV") system operators coincide with open air RF signals, such as air traffic control, navigation, cellular services, and the like. Federal regulations therefore require cable TV systems to maintain a low degree of cable system RF signal egress. CFR Title 47, Part 76, Subpart K-Technical Standards define requires that when operating in the in the frequency bands of 108-137 MHz and 225-400 MHz, where cable TV transmissions take place, RF leakage or egress be no more than 20 µV/m when measured at 3 meters (§ 76.610, § 76.611).

To decrease RF signal egress to below the threshold defined above, the cables used in cable TV systems to convey audio-visual signals from a headend to subscriber locations and convey messages from subscriber locations to the headend, such as coaxial cables, are typically shielded. Common types of cable shielding include foil, braid, and multilayer shielding configurations including both foil and braid, for example.

Shielding can deteriorate or may be damaged by environmental conditions, such as wind, a tree falling on the cable, rubbing between the cable and a utility pole, lightning strikes, for example. Shielding may also be damaged by animals by natural deterioration due to age or animals that chew on the cable, for example. Such deterioration and damage may result in signal egress that may interfere with open air RF signals used by the other systems noted above. Signal egress points also allow for ambient signal ingress into the cable, which may also interfere with signals being transmitted along the cable and may be deleterious to the performance cable TV systems.

Various techniques have been used to identify signal egress points so that they may be repaired. In one example, repair people are sent into the field with a bucket truck and a leak detector, such as a spectrum analyzer or RF meter. When a signal is detected that is above an allowable threshold, indicating excessive signal egress, the location of the signal egress is located, and the cable is repaired. Repair people may also walk under or near cables with an RF meter or other such leak detector, or drive by cables with an antenna mounted on a roof of a vehicle, for example, to detect excessive signal egress. Planes and drones carrying leak detectors spectrum are also used. Signal egress has also been identified by detecting a signal injected into the cable by the headend.

In U.S. Pat. No. 5,777,662, an antenna mounted in a vehicle that emits a tone that can enter a cable via a flaw. The tone is detected by a monitoring receiver in the head end of the cable communications system. A receiving antenna on the vehicle may also detect egress signals. A GPS antenna may also be provided on the vehicle so that location data may be correlated with detected egress signals.

SUMMARY OF THE INVENTION

Since RF signals carried by cable television ("CATV") cables coincide with open air RF signals, it is difficult to differentiate between RF signals leaking from an egress point of the CATV cable RF signals from other sources. It is difficult to locate signal egress/ingress points merely by walking or driving along cable systems with metering devices. Further localization efforts are therefore required before repairs can be made. This is also true for flying leak detectors. The addition of GPS data location systems still requires time and effort to precisely locate signal egress/ingress points.

Improved signal egress systems that more precisely detect and isolate the locations of signal egress/ingress points along a cable would be advantageous. The signal egress/ingress may be due to a compromise of the integrity of the shielding, such as a defect caused by environmental conditions, deterioration due to age, animals, etc. Loose components of the tap, amplifier, or other components of the cable system may also cause signal egress/ingress. Loose components are also referred to as defects herein.

In accordance with an embodiment of the invention, signal ingress/egress points in a coaxial cable of a cable transmission system, such as a cable TV transmission system, are identified by exposing the coaxial cable to an RF signal with a known characteristic emitted by an antenna on a device traversing the cable and monitoring the signals in the cable for the inserted RF signal.

In accordance with an embodiment of the invention, an apparatus is disclosed comprising a carriage and a roller attached to the carriage. The roller is configured to sit on a cable plant, which includes a strand, a cable, and a lashing wire lashing the cable to the strand. The apparatus further comprises a motor attached to the carriage. The motor is coupled to the roller to cause rotation of the roller in at least a first direction, to cause movement of the carriage across the cable plant in at least the first direction. A transmitter is attached to the carriage and an antenna is coupled to the transmitter. The antenna is configured to emit an RF signal under the control of the transmitter. A processing device is coupled to the motor to cause the motor to rotate in at least the first direction. The processing device is coupled to the antenna to control operation of the antenna.

The processing device may be configured to turn the transmitter on and off in response to a control signal. The processing device may be further configured to cause the motor to selectively rotate in the first direction or in a second direction opposite the first direction, in response to a control signal. This causes rotation of the roller in the first direction and in the second direction, to cause movement of the carriage across the cable plant in the first direction and in the second direction. The apparatus may further include a receiver to receive the control signal.

The motor may be at least one reversible motor, and the apparatus may further comprise a second roller attached to the carriage and coupled to the at least one reversible motor. The motor may then cause rotation of the first roller and a second roller in the first direction and in the second direction opposite the first direction.

At least one third roller may be attached to the carriage, below the first roller and the second roller. The first roller, the second roller, and the third roller may be positioned on the carriage so that when the apparatus is placed on the cable, the first roller and the second roller are placed on an upper surface of the cable and the third roller is positioned below the cable. The position of the third roller may be adjustable so that after placement of the apparatus on the cable, the third roller is movable with respect to the cable to be brought close to or in contact with a lower surface of the cable. The carriage may define a groove through the carriage, and the second roller may include a rod perpendicular to a rotational axis of the roller. The rod may protrude from the second roller, through the groove and is moveable within the groove to adjust the position of the second roller. A connector may be provided to secure the second roller in position in the groove, in contact with the lower surface of the cable. The rod may be threaded, and the connector may comprise a wingnut to secure the second roller to the carriage in the position. A pivoting arm may be coupled to the carriage. The pivoting arm may have a first position rotated away from the cable plant and a second position rotated toward the cable plant, to secure the apparatus to the cable plant.

In accordance with another embodiment of the invention, a method of identifying a signal ingress point in a cable is disclosed comprising moving an antenna along a span of the cable in a first direction and emitting a radio-frequency signal toward the cable, by the antenna, while moving the antenna across the cable. Signals within the cable are monitored while moving the antenna across the cable. It is determined whether there is a signal ingress point based, at least in part, on whether the emitted radio-frequency signal is detected within the cable.

The antenna may be supported by a carriage and the method may comprise moving the antenna across the span by moving the carriage across the cable by a motor driven roller. The signals may be monitored on a display on a control device coupled to a cable tap, for example. The signals may be monitored by identifying a peak or near peak in the displayed signal, wherein the peak is indicative of signal ingress in the cable proximate the location of the antenna. The peak may be identified automatically, for example. Automatic identification may include automatically identifying a first received signal as a peak when a second received signal received after the first received signal has a characteristic different from the characteristic of the first received signal by at least a predetermined amount. The signals may be filtered by the control device to remove signals conveyed by the cable in normal operation, and not removing the emitted signal.

Movement of the antenna may be selectively controlled in the first direction and in a second a second direction opposite to the first direction, via the control device. The control device may be controlled by an operator or may be controlled automatically, based, at least in part, on the detected signal, by a processing device. If it is determined that there is a signal ingress point, the method further includes repairing the signal ingress point.

In accordance with another embodiment of the invention, a system for identifying a signal ingress point in a cable is disclosed comprising a self-propelled apparatus movable on the cable. The apparatus comprises an antenna and a control device to control operation of the self-propelled apparatus. The control device comprises a transmitter to transmit control signals to the self-propelled apparatus, an electrical connector to be coupled to the cable, a receiver to receive signals from the cable, via the connector, and a display to display signals received from the cable.

The self-propelled apparatus may further comprise a carriage, wherein the antenna is coupled to the carriage. At least one roller is coupled to the carriage. At least one motor is coupled to the at least one roller. The motor may be configured to cause rotation of the at least one roller in at least a first direction, to propel the self-propelled apparatus along the cable.

At least one second roller may be coupled to the carriage below the at least one first roller. In this example, the first roller is configured to sit on top of the cable and the position of the second roller on the carriage is adjustable to bring the second roller into contact with a bottom of the cable. The control device may further comprise a keypad for entry of control signals by an operator.

It is noted that reference to the carriage sitting on the cable includes the carriage sitting on the cable and vice a versa.

BRIEF DESCRIPTION OF THE FIGURES

FIG. 14 is a flowchart of an example of a method for operation of a span crawler, in accordance with an embodiment of the invention.

DESCRIPTION OF PREFERRED EMBODIMENTS

Figure 1:
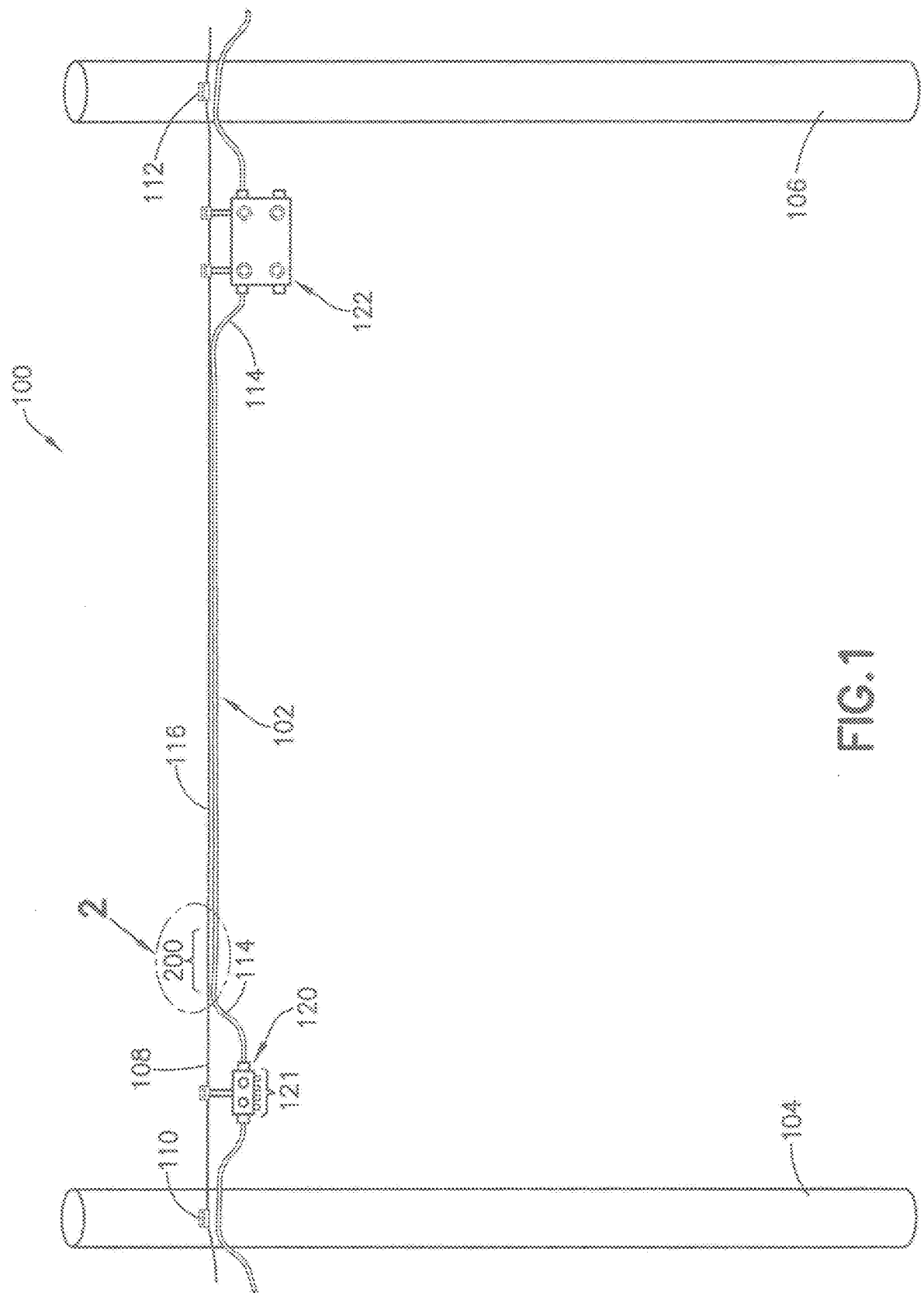
FIG. 1 is a side view of an example of a section of a cable plant of the cable transmission system suspended between two utility poles in a cable TV system, in which embodiments of the present invention may be used.

FIG. 1 is a side view of an example of a section 100 of a cable plant 102 of the cable transmission system suspended between two utility poles 104, 106 in a cable TV system, in which embodiments of the present invention may be used. Utility poles are typically from about 30 feet to about 50 feet apart, but may be up to about 500 feet apart, for example. The cable plant 102 includes a strand 108 of the cable system, which may be made of steel, that is attached to the two utility poles 104, 106 by a clamp 110, 112 mounted to the utility poles, as is known in the art. The cable plant 102 further includes a cable TV ("CATV") coaxial cable 114 (hereinafter referred to as the "cable") lashed to the cable system strand 108 by a lashing wire 116. The lashing wire 116 may also be made of steel, for example. Lashing of the coaxial cable 114 to the strand 108 is shown in more detail in FIG. 2. As used herein, the term "cable plant" 102 refers to the combination of the strand 108, the cable 114, and the lashing wire 116.

A tap 120 of the cable system hangs from the cable system strand 108 proximate the utility pole 104. The cable 114 is not lashed to the strand 108 proximate the tap 120 to facilitate connection of an end of the cable to the tap, as shown in FIG. 1. The tap 120 includes multiple ports 121 for the connection of the cable 114 to subscriber's homes and for the connection of monitoring equipment, for example.

An amplifier 122 is suspended from the cable system strand 108 proximate the utility pole 108. The coaxial cable 114 is similarly not lashed to the strand 108 proximate the cable system amplifier 122 to facilitate connection of an end of the coaxial cable to the amplifier, as is also shown in FIG. 1.

Figure 2:
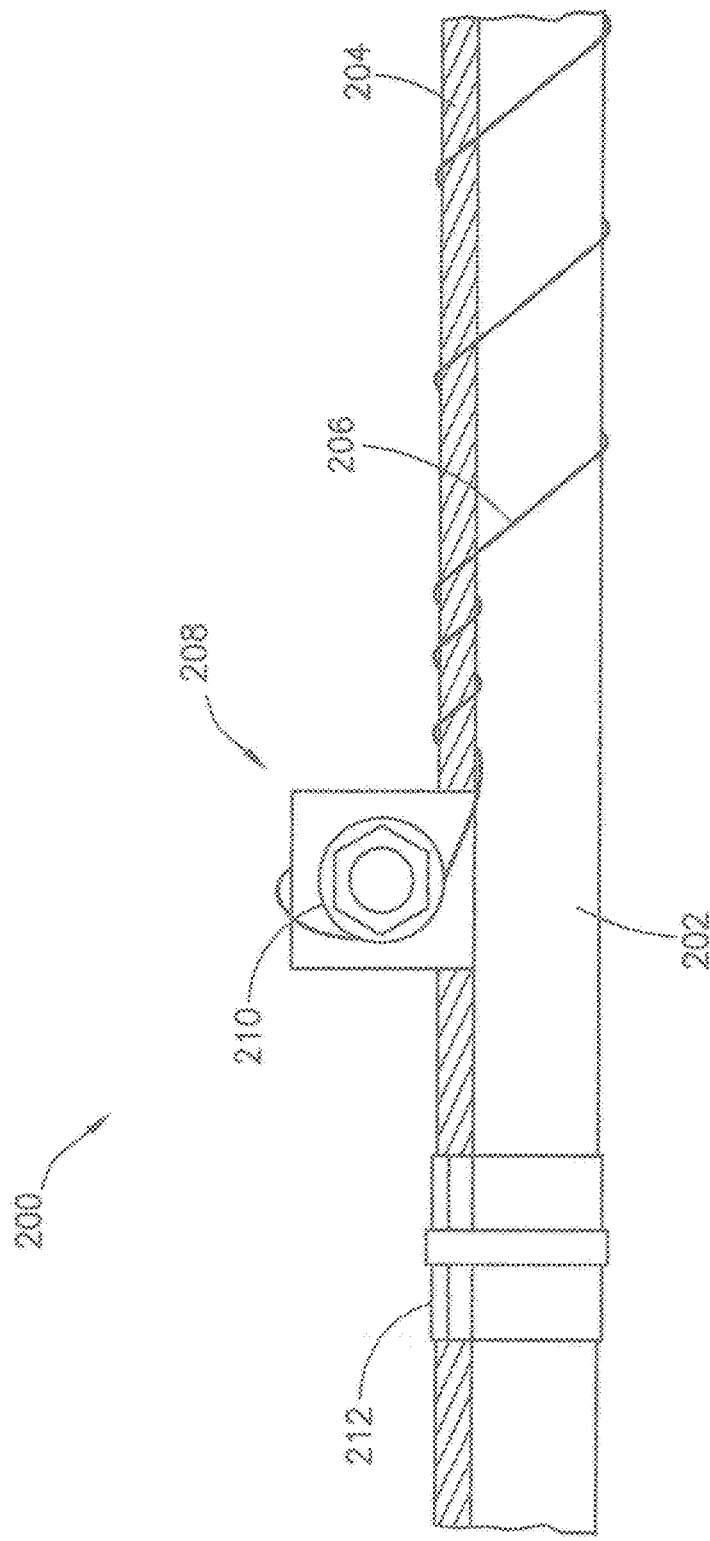
FIG. 2 is an enlarged side view of a portion of the cable plant of FIG. 1, showing a cable lashed to a strand by a lashing wire.

FIG. 2 is an enlarged side view of a portion 200 of the cable plant 102 of FIG. 1, proximate that tap 120 (not shown in FIG. 2), showing a cable 202 lashed to a strand 204 by a lashing wire 206. A lashing wire clamp 208 including washers 210 is shown, for provide a termination for the lashing wire 206, as is known in the art. A strap and spacer 212 are also shown. As is known in the art, the strap and spacer 212 assists in preventing movement of the cable 202 against the utility pole 104, 106 shown in FIG. 1. The strap and spacer 212 may be about five (5) feet from the tap 120 in FIG. 1, for example. Another lashing wire clamp and strap and spacer may similarly be provided about five (5) feet from the amplifier 122 in FIG. 1, for example.

Figure 3:
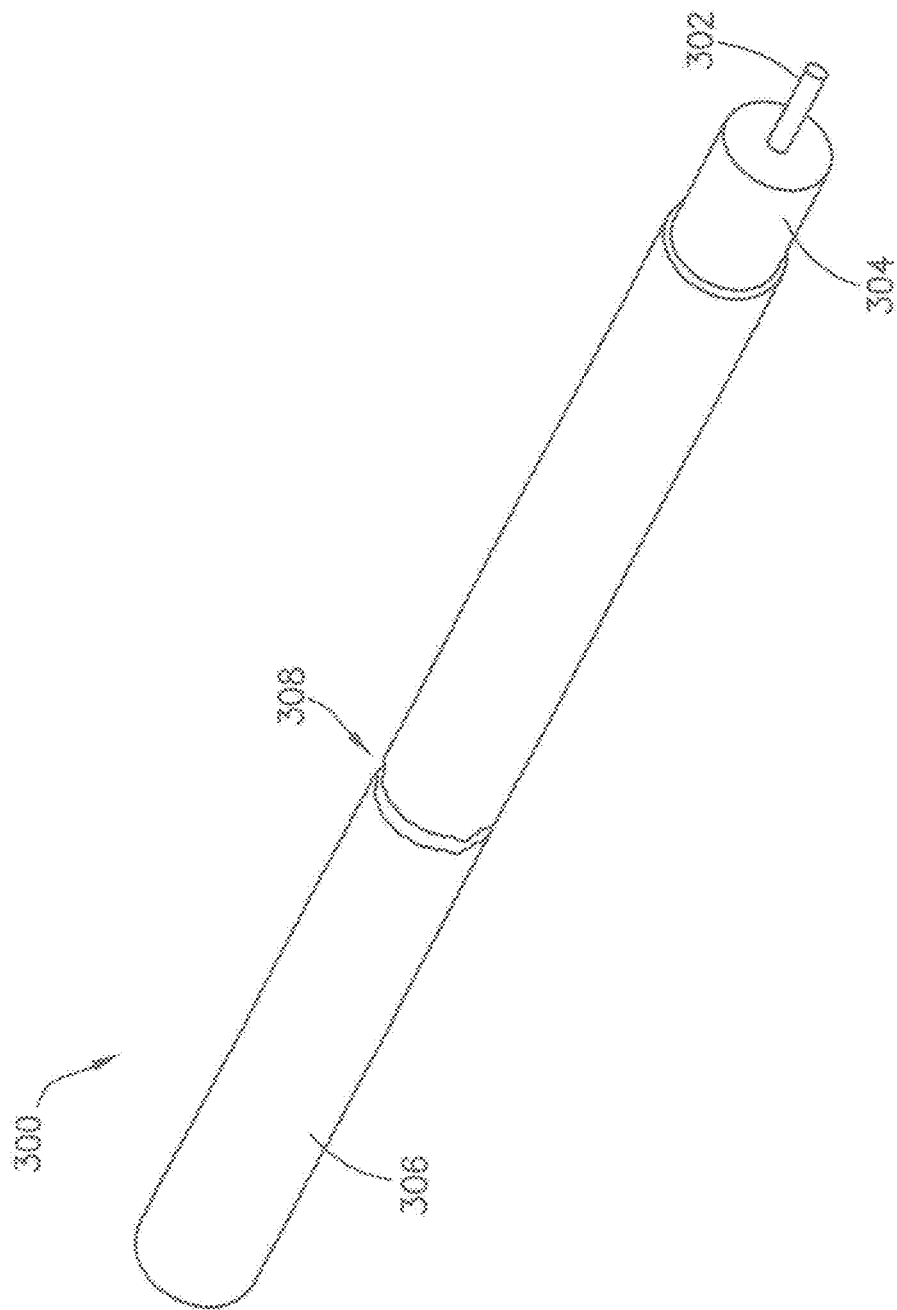
FIG. 3 is a perspective view of a CATV coaxial cable 300 including a conductor 302, such as a copper clad aluminum conductor, for example.

FIG. 3 is a perspective view of a CATV coaxial cable 300 including a conductor 302, such as a copper clad aluminum conductor, for example. Around the conductor 302 is a dielectric insulator 304, such as a polyethylene foam. A semi-rigid shield 306, which also acts as an outer conductor, may comprise semi-rigid aluminum, for example. A radial crack 308 that causes exposure of the dielectric insulator 304, which may enable signal egress and signal ingress, is also shown.

Figure 4:
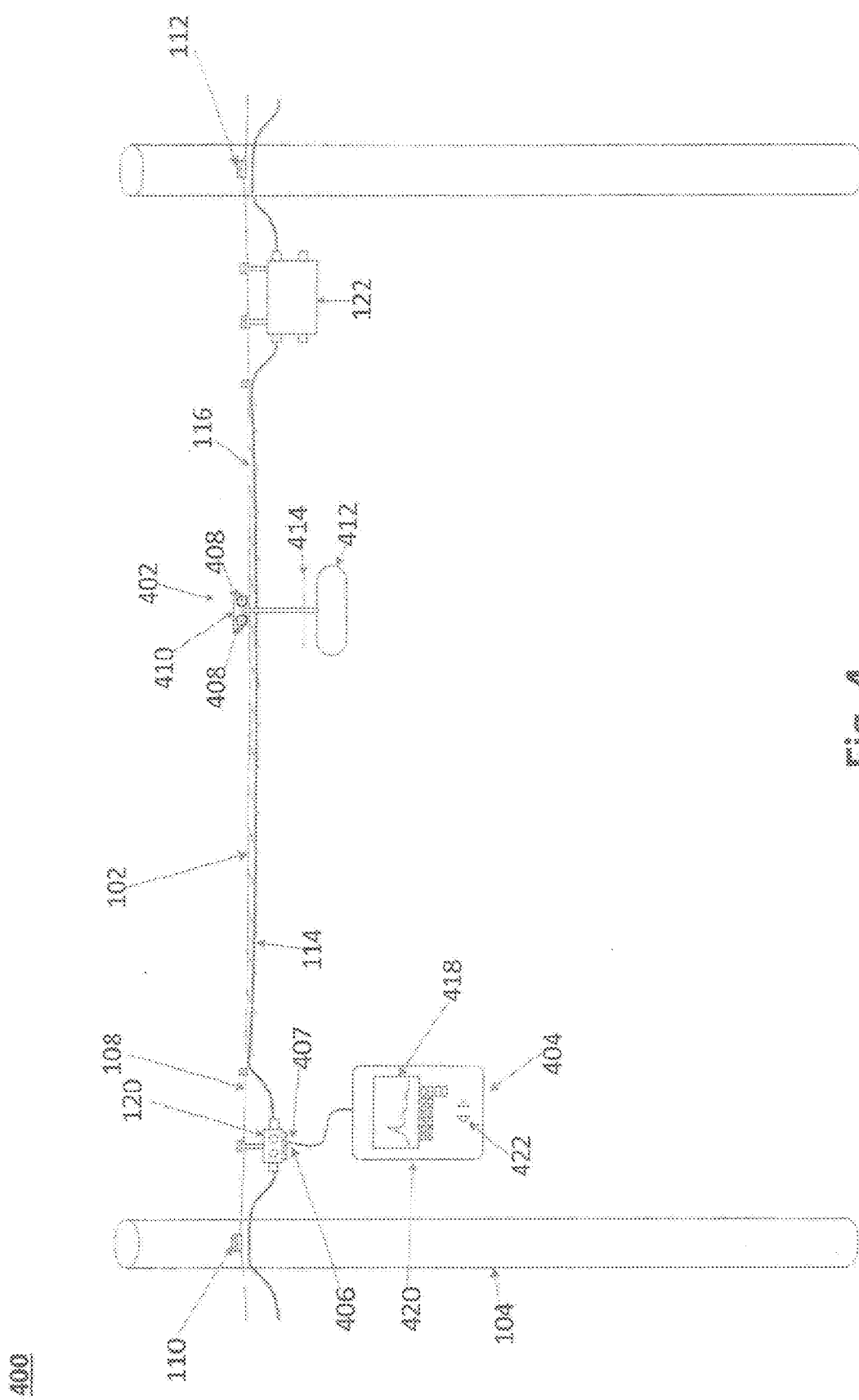
FIG. 4 is a side view of an example of a section of a cable plant of the cable transmission system suspended between two utility poles in a cable TV system, as in FIG. 1, including a robot or a robotic apparatus, referred to herein as a span crawler or span crawler unit, and a control device for the span crawler unit, in accordance with an embodiment of the invention.

FIG. 4 is a side view of a section 400 of a cable plant 102 corresponding to the section 100 of FIG. 1, in which components common to FIG. 1 and FIG. 2 are commonly numbered. A system in accordance with this embodiment of the invention includes a robot or a robotic apparatus 402, referred to herein as a span crawler 402, and a control device 404 for the span crawler. The span crawler 402 is attached to the cable 114, over the lashing wire 116. An input 406 of the control device 404 is attached to a port 407 of the tap 120, to receive RF signals from within the cable 114.

The span crawler 402 in this example includes two upper rollers 408, for causing the span crawler 402 to move across the cable 114. In the example of FIG. 4, the upper rollers are attached to an upper portion of a carriage 410. When the span crawler 402 is attached to the cable 114, between the lashing wire clamps 208, 209 the upper rollers 408 are configured to sit on an upper surface of the cable plant. In other examples, the upper rollers may sit on the cable itself. As used herein, reference to the upper rollers 408 sitting on the cable includes sitting on the cable, and vice a versa. The upper rollers 408 may each be rubber wheels, plastic wheels, or a combination of rubber and plastic wheels, for example. Other materials may also be used. An example of an upper roller is discussed below with respect to FIG. 6. The first roller 406 and the second roller 408 are coupled to the same or different motors, which are not shown in this view. In other example, more or fewer upper rollers may be provided. In one example, the two upper rollers 408 and the motors may be configured to cause the span crawler 402 to move at a speed up to about 1.0 feet per second. In another example, the two upper rollers 408 and the motors may be configured to cause the span crawler 402 to move at a speed up to about 0.50 feet per second.

The span crawler 402 is configured so that a lower portion of the carriage 410 extends below the cable 114 when the span crawler is attached to the cable. The second portion of the carriage 410 supports a transmitter 412 and an antenna 414. The span crawler 402 is shown in more detail in FIG. 5.

Rotation of the upper rollers 408 in a first rotational direction, such as clockwise, causes the span crawler unit 202 to move in a first direction across the cable 114, in this example toward the cable system amplifier 122. Rotation of the upper rollers 408 in a second rotational direction opposite the first direction, here counterclockwise, causes the span crawler unit 402 to move in a second direction across the CATV coaxial cable 114, in this example toward the tap 120.

While the span crawler 202 is moved across the cable 114, the transmitter 412 causes the antenna 414 to emit RF signals. If there is a defect in the cable 114, such as a hole, radial crack (such as the radial crack 308 shown in FIG. 3) partial radial crack, or loose component, for example, the emitted RF waves may enter the cable 114 and be detected by the span crawler control unit 202. As the span crawler 202 moves close to the tap 120 and the 122, the emitted RF waves may enter the cable 114 through loose components, such as loose connectors, for example. It is noted that the span crawler 402 need not be directly positioned over the defect for emitted RF waves to enter the cable 114. The control unit 404 in this example is a portable, handheld unit.

In accordance with certain examples of embodiments of the invention, the span crawler 402 may be up to about fifty (50) feet from a defect for enough RF waves to enter the coaxial cable 114 to be detected. In other examples, the span crawler 102 may be configured so that emitted RF waves may be detected if the span crawler is closer to or farther from a respective defect. A span crawler 402 adjacent to the lashing wire clamps 208 could, therefore, emit RF waves that would enter a defect in the cable 114 between the respective lashing wire clamp 208 and the tap 120 or the lashing wire 209 and the amplifier 122, or loose components of the tap or the amplifier. Alternatively, the span crawler 402 may be placed on the section of the cable 114 between the lashing wire clamp 208 and the tap 120, and on the section of the cable 114 between the lashing wire clamp 209 and the amplifier 122.

Detection of a characteristic of the emitted RF signals, such as the amplitude or frequency of the RF signals, is indicative of a defect in the cable 114. Detection of the characteristic and identification of the location of the defect are discussed further below. The characteristic of the emitted RF signals may be different from a corresponding characteristic the RF signals normally carried by the cable 114, to facilitate detection of the emitted RF signals. For example, the emitted RF signals may have an amplitude different from the amplitudes of the RF signals carried by the cable 114, such as higher amplitude, for example. The amplitude of the emitted signal may be about 10 decibels or more above the amplitude of the RF signals carried by the cable 114 in normal operation, for example. In addition to or instead of a different amplitude, the emitted RF signals may have a frequency different from the frequencies of the RF signals normally carried by the cable 114. The RF signals carried by the cable 114 may also be filtered by the span crawler control 202 to facilitate detection by the span crawler control, as discussed further below.

The control unit 404 includes a display 418, a keypad 420, and arrow keys 422. The arrow keys 422 enable an operator, such as a cable repair person, to control operation of the span crawler control unit 402. The control unit 404 includes a spectrum analyzer, a signal level meter, or similarly functioning device (not shown in FIG. 4), as discussed below with respect to FIG. 10, for example. The control unit 404 may communicate with the span crawler 402 wirelessly, such as via WIFI or Bluetooth, for example. Other wireless techniques that may be used include Ble, Zigbee, Z-Wave, 6LoWPAN, NFC, WiFi Direct, GSM, LTE, LoRa, NB-IoT, or LTE-M, for example.

Figure 5:
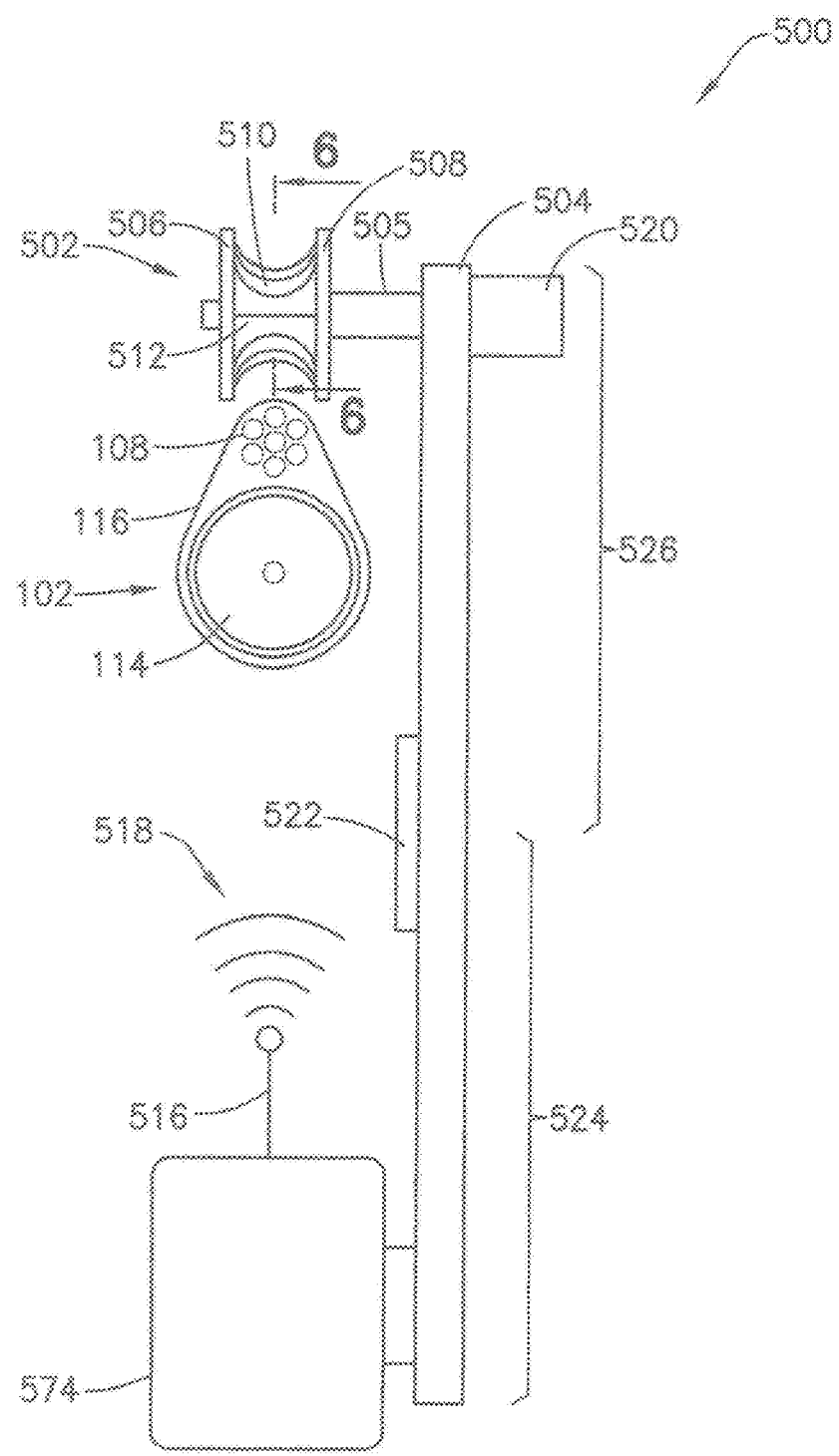
FIG. 5 is a side view of a span crawler unit corresponding to the span crawler of FIG. 4, along the cable plant.

FIG. 5 is a side view of a span crawler unit 500 corresponding to the span crawler 402 of FIG. 4, along the cable plant 102. The strand 108, the cable 114, and the lashing wire 116 are shown in cross-section. Above the cable plant 102 is a first upper roller 502 coupled to a carriage 504. A second upper roller, which is not shown in this view, is behind the first upper roller 502. The first upper roller 502 is shown connected to a carriage 504.

In this example, the first upper roller 502 includes opposing sidewalls 506, 508 and an optional concave curved surface 510 between the side walls. The curvature of the concave curved surface 510 matches the curvature of the portion of the cable plant 102 engaged by the first upper roller 802 so that the first upper roller 502 fits on the cable plant. Horizontal lines 512 following the curvature of the concave curved surface 510 represent optional protrusions on the concave curved surface, which may facilitate engagement of the first roller 502 with the lashing wire 116 and the remainder of the cable plant 102. The protrusions 512 may be grooves, teeth, or pointy tips, for example. The protrusions 512 may have the configuration shown in FIG. 6, for example, as discussed further below. A second upper roller, which has the same configuration as the first upper roller 502, is behind the first upper roller and is not shown in this view. The first upper roller 502 (and the second upper roller) be rubber wheels, plastic wheels, or a combination of rubber and plastic wheels, for example. Other materials may also be used. An example of an upper roller is discussed below with respect to FIG. 6. While the concave curved surface 510 would be in contact with the cable plant 102 when the span crawler 500 is placed on the cable plant, in FIG. 5, the concave curved surface 510 and the cable plant are shown separated for illustrative purposes.

Figure 6:
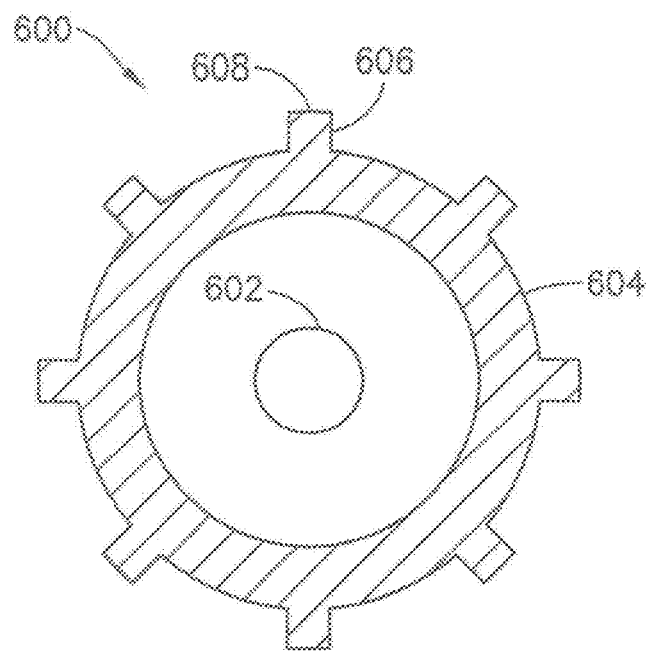
FIG. 6 is a cross-sectional view of an example of a first roller, through line 6-6 of FIG. 5.

FIG. 6 is a cross-sectional view of an example of a first roller 600, through line 6-6 of FIG. 5. The first roller 600 includes a central opening 602 for receipt of an axle or rod coupled to a motor, as discussed further below. A curved concave surface 604, which is a circle in this view, has a series of rectangular protrusions 606 with flat tips 608. Eight (8) protrusions 606 are shown in this example. More or fewer protrusions 606 may be provided. Each protrusion may extend up to one-quarter inch from the curved concave surface 604, for example. In the example of FIG. 6, the first roller 600 includes an inner portion 610, which may be a hard plastic, and an outer portion 612, which may be rubber, such as a soft rubber, for example. Other materials may be used as well.

Returning to FIG. 5, a transmitter 514 is mounted to the carriage 504. An antenna 516 is electrically coupled to the transmitter 510, between the transmitter and the first upper roller 502. The span crawler 500 is configured so that the antenna 512 faces the underside of the cable 114 when the span crawler 500 is attached to the cable plant 102. RF waves 518 are shown in FIG. 5 being emitted from the antenna 512 toward the cable 114. While in this example the transmitter 510 and the antenna 512 are shown below the cable 114 when the span crawler 500 is attached to the cable, in other configurations the transmitter and the antenna may be above the cable, adjacent to the first upper roller 306, the second upper roller, or between the upper rollers, for example.

A motor 520 is connected to an opposite side of the carriage 504 than the first upper roller 502. The motor 520 is coupled to the first upper roller through the carriage, via an axle or rod 505. The motor 520 selectively causes rotation of the first upper roller in a first direction and in a second direction opposite the first direction. While in this example the motor 508 is on an opposite side of the carriage 504 than the first upper roller 502, in other configurations, the motor and the first upper roller may be mounted on the same side of the carriage. In this case, the motor may cause rotation of the first roller 306 by one or more pulleys and/or gears, for example. The motor 508 may also drive the second upper roller by one or more pulleys and/or gears, or a separate motor may be provided to drive the second upper roller.

Figure 11:
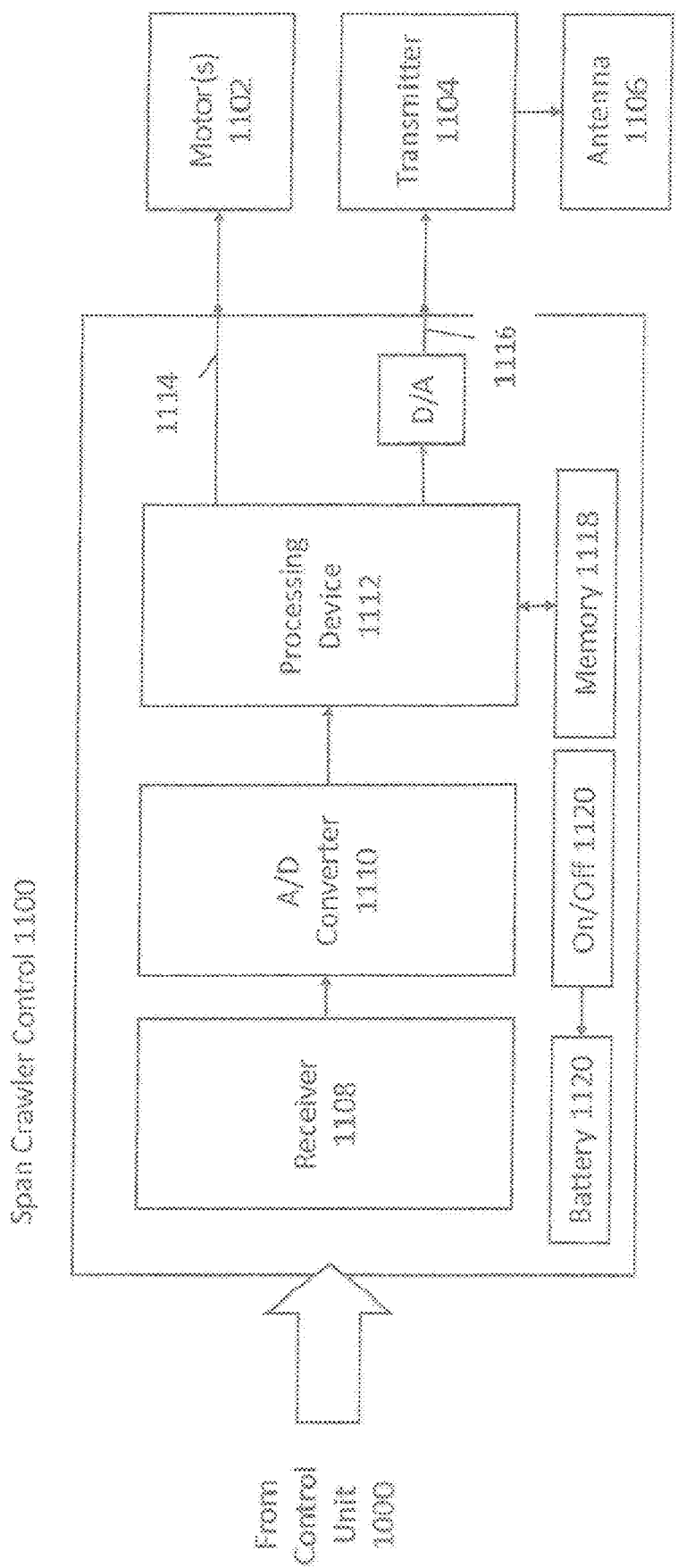
FIG. 11 is a block diagram of an example of a span crawler control device that is located on the span crawler.

A span crawler control device 522 is provided on the carriage 504 for receiving control signals from a control device, such as the control device 404 of FIG. 4. The span crawler control device 516, which may be a printed circuit board (PCB), may be connected to the first motor 520, the second motor, and the transmitter 510 via wires, conductive strips, or wirelessly, for example. FIG. 11 is a block diagram of an example of the span crawler device 522 of FIG. 5.

In one example, a lower portion or half 524 of the span crawler 500 below the cable plant 102 is heavier than the upper portion or half 526 above the cable plant, to assist in maintaining the proper orientation of the span crawler while the span crawler is moving along the cable plant. The span crawler 700 may weigh from about 3 pounds to about 5 pounds, for example, and the lower portion 514 may be at least about 1.5 times heavier than the upper portion 526, for example.

Figure 7:
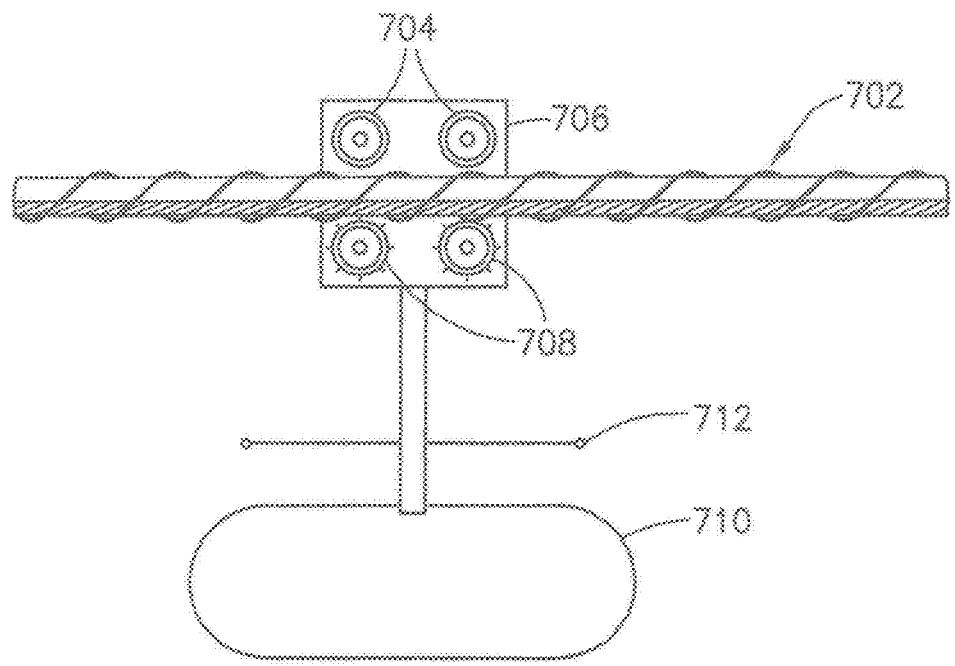
FIG. 7 is a second example of a span crawler on a segment of a cable plant, in accordance with an embodiment of the invention.

FIG. 7 is a second example of a span crawler 700 on a segment of a cable plant 702, in accordance with an embodiment of the invention. In addition to the two upper rollers 704 connected to a carriage 706, one or more lower rollers 708, are positioned below the upper rollers, under the cable plant 102 when the span crawler is positioned on the cable plant. In this example, the span crawler 700 includes two lower rollers 708. Also supported by the carriage are a transmitter 710. An antenna 712 protrudes from the transmitter 710, toward the cable plant 102, as discussed above with respect to FIG. 4 and FIG. 5. The lower rollers 704 in this example secure the span crawler 700 to the cable plant 102. They may also assist in maintaining the span crawler in a desired orientation on the cable plant, as discussed below.

Figure 8A:
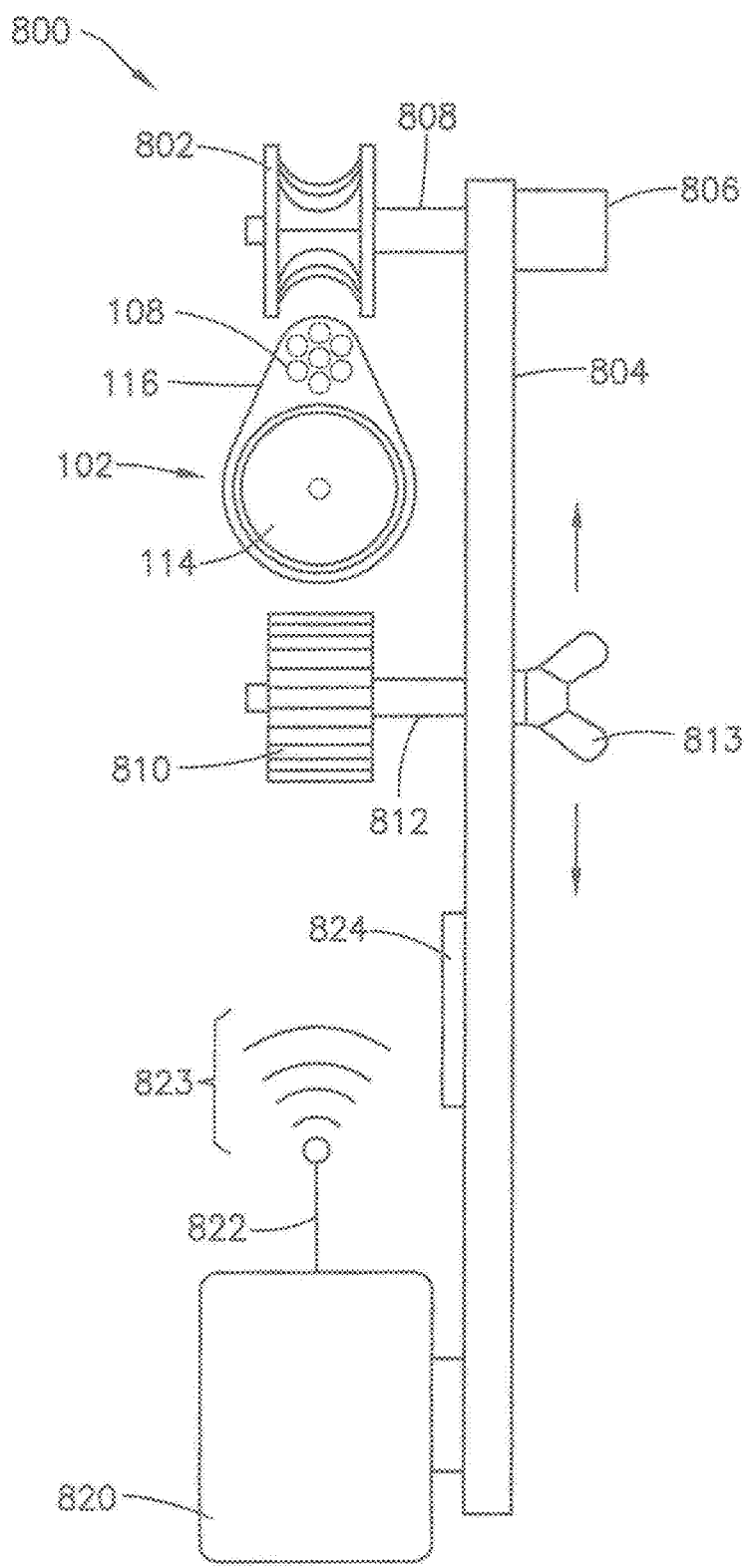
FIG. 8A is a side view of a span crawler unit corresponding to the span crawler of FIG. 7, along the cable plant.

FIG. 8A is a side view of a span crawler unit 800 corresponding to the span crawler 700 of FIG. 7, along the cable plant 102. Cross-sections of the strand 108, the cable 114, and the lashing wire 116 of the hardline are shown. In this example, a first upper roller 802, which has the same configuration as the first roller 502 of FIG. 5, is coupled to a carriage 804. A second upper roller, which has the same configuration as the first upper roller 802, is behind the first upper roller and is not shown in this view. The first upper roller 802 (and the second upper roller) may be made of molded rubber or plastic, or a combination of materials, for example, as discussed above.

A first motor 806 is attached to an opposite side of the carriage 804 as the first upper roller 802 and is coupled to the first upper roller via an axle or rod 808. The first motor 808 is configured to selectively drive the first upper roller 802 in a clockwise direction and in a counterclockwise direction. A second motor (not shown in this view) is similarly provided for driving the second upper roller in a clockwise and in a counterclockwise direction.

A first lower roller 810 is provided on the carriage 804, below the first upper roller 802, to secure the span crawler to the cable plant 102. The first lower roller 810 is rotatable about an axle or rod 812 that extends through the carriage 804. The first lower roller 810 may each be rubber wheels, plastic wheels, or a combination of rubber and plastic wheels, for example. Other materials may also be used. A second lower roller, not shown in this view, may be provided below the second upper roller. The surface of the first lower roller 810 (and the second lower roller) may be flat, as shown in FIG. 8A or may be concave, as in the first upper roller 802.

It would be apparent to one of ordinary skill in the art that there must be sufficient space between the first upper roller 802 and the first lower roller 810 for the span crawler 800 to be placed on the cable plant 102. The vertical position of the first lower roller 810 is therefore adjustable so that it can be positioned a sufficient distance away from the first upper roller 802 sot that the span crawler can be placed onto the cable plant 102 and then moved closer to or in contact with the cable plant after the span crawler is placed on the cable plant. In this example, at least a portion of the axle or rod 812 is threaded and the first lower roller 810 is secured to the carriage 804 in a desired vertical position via a wingnut 813. The adjustment mechanism is discussed in more detail below with respect to FIG. 8B.

A transmitter 820 is also shown connected to the carriage 804. An antenna 822 is shown coupled to the transmitter 820. RF waves 823 are shown schematically, being emitted by the antenna 822. A span crawler control device 824 is provided on the carriage 804 for receiving control signals from a control device, such as the control device 404 of FIG. 4. The span crawler control device 824 may be a printed circuit board (PCB) and may be connected to the first motor 806 and the transmitter 820 via wires, conductive strips, or wirelessly, for example.

Figure 8B:
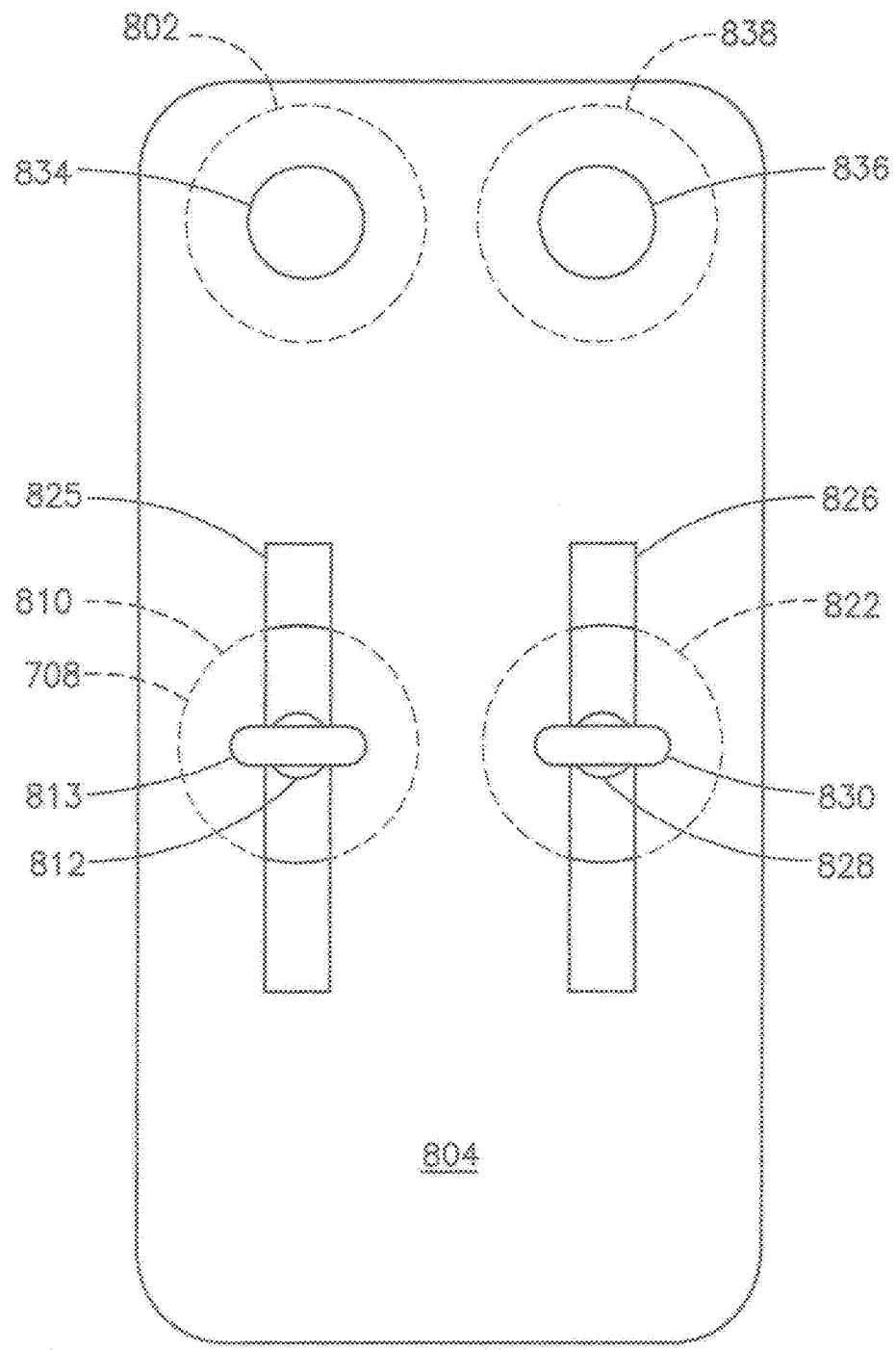
FIG. 8B is rear view of the span crawler of FIG. 8A.

FIG. 8B is rear view of the span crawler 800 of FIG. 8A, showing an example of a mechanism for adjusting the vertical position of a first lower roller 810 and a second lower roller 822 on the carriage 804. The mechanism in this example includes a first vertical groove 825 and a second vertical groove 826, each defined through the carriage 804. The axle or rod 812 of the first lower roller 810 and an axle or rod 828 of the second lower roller 822 each extend through a respective first and second vertical groove 825, 826. The portion of the axle or rods 812, 828 extending through the respective first and second vertical grooves 825, 826, respectively, are threaded. Wingnuts 813, 830 are on the threaded axles or rods 812, 828.

The vertical position of the first lower roller 810 and the second lower roller 822 within the respective first and second vertical grooves 825, 826 may be adjusted by a user when the span crawler 800 is placed on the cable plant 102 by manually moving the respective wingnut 813, 830 vertically up and down within the respective first and second vertical grooves 825, 826. The respective axles or rods 812, 828 may also be grasped and moved along with or instead of the respective wingnuts 813, 830 to move the first lower roller 810 and the second lower roller 822 vertically up and down. Portions of the axle or rod 812, 828 extending through to the rear of the carriage 804, behind the wingnuts 813, 830, may also be attached to each other by a horizontally extending beam (not shown) so that the first lower roller 810 and the second lower roller 822 may be moved vertically up and down together by grasping and moving the horizontally extending beam. In another example, a single lower roller may be used, centered between and vertically below the first upper roller 924 and the second upper roller 928. When the first lower roller 810 and the second lower roller 822 are in a desired position, the respective wingnuts 813, 830 may be tightened, securing the respective axles 812, 828 to the carriage 804. It would be understood by those of ordinary skill in the art that additional structures may be provided on the first axle or rod 812, 828. For example, a washer (not shown) may be fixed to the axle or rod 812, 828 on the front side of the carriage 804 so that when the wingnuts 813, 830 are tightened, the axle or rod will be secured to the carriage. Another washer (not shown) may also be provided between each wingnut 813, 830 and the carriage 804.

FIG. 8B also shows a first motor 834 for driving the first upper roller 802 (shown in phantom) and a second motor 836 for driving a second upper roller 838 (also shown in phantom). The first upper roller 802 and the second upper roller 838 are shown in phantom because they are behind the carriage 804 in this view. The motors 834, 836 are configured to selectively rotate the first upper roller 924 and the second upper roller 928 clockwise and counterclockwise.

Instead of the wingnuts 813, 830, a clamp, such as cam clamp, attached to the portion of the axles or rods 812, 828 extending through the carriage 804, may be used to tighten the first lower roller 810 and the second lower roller 822, respectively, to the carriage, for example. In another example, one or more springs may be mounted on or within the carriage 804 to push the first lower roller 810 and the second lower roller 822 toward and against the cable plant 102. The first lower roller 810 and the second lower roller 822 may be moved downward manually, against the force of the spring, during attachment of the span crawler to the coaxial cable 102. After positioning the span crawler 800 on the cable plant 102 and releasing the downward force on the first lower roller 810 and the second lower roller 822, the springs will push the first lower roller and the second lower roller against the cable plant 102.

The weight of the span crawler 800 causes sufficient contact between the concave curved surface of the first roller 802 and the cable plant 102 for rotation of the first roller 302

(and the second upper roller) to cause the span crawler 800 to move across the cable. The span crawler 800 may weigh from about 3 pounds to about 5 pounds, for example. As above, the lower portion or half of the span crawler 800 may be at least about 1.5 times heavier than the upper portion or half, for example.

The first lower roller 814 (and the second lower roller) are positioned to bear against the cable 114 so that the first lower roller (and the second lower roller) rotate as the span crawler 800 moves across the cable. The first lower roller 814 (and the second lower roller) are not positioned to bear so tightly against cable plant 102 that movement of the span crawler 800 is impeded.

The weight of the span crawler 800 causes sufficient contact between the concave curved surface of the first roller 802 and the cable plant 102 for rotation of the first roller 810 and the second upper roller 822 to cause the span crawler 800 to move across the cable. The span crawler 800 may weigh from about 3 pounds to about 5 pounds, for example. As above, the lower portion or half of the span crawler 800 may be at least about 1.5 times heavier than the upper portion or half, for example.

To further secure the span crawler 800 to the cable plant 102, the first lower roller 810 and the second lower roller 822 may be moved to be within about 3 inches of the cable plant 102, such as within 2 inches or within 1 inch of the cable plant, for example. In this case, the first lower roller 810 and the second lower roller 822 may periodically come into contact with the cable plant 102 as the span crawler moves across the cable plant. When in contact with the cable plant 102, the first lower roller 810 and the second lower roller 822 may rotate as the span crawler moves along the cable plant. The first lower roller 810 and the second lower roller 822 may also be positioned to bear against the cable plant 102, in which case the first lower roller and the second lower roller would rotate as the span crawler 800 moves across the cable plant. The first lower roller 810 and the second lower roller 822 should not be positioned to bear so tightly against cable plant 102 that movement of the span crawler 800 is impeded.

Figure 9A:
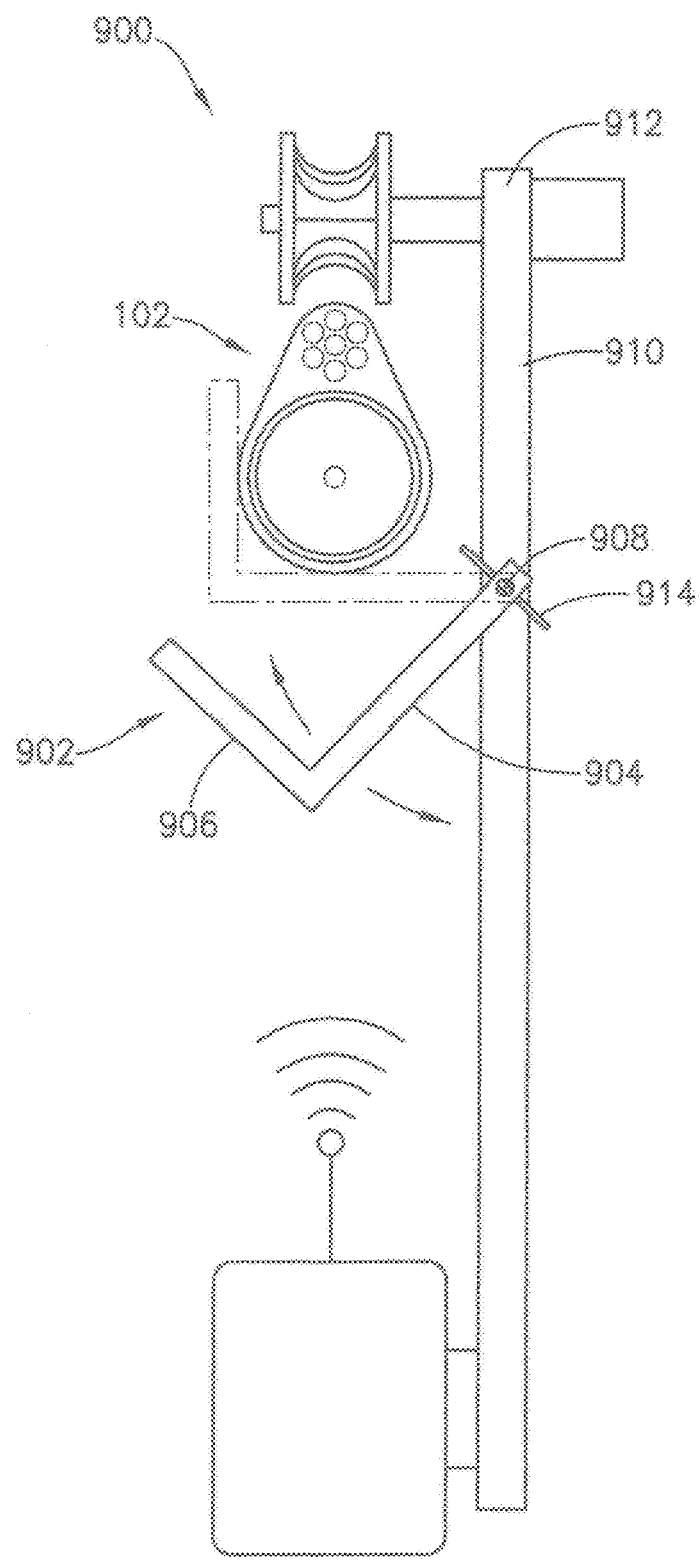
FIG. 9A is a side view of an additional example of a span crawler, in accordance with an embodiment of the invention, including a pivot arm to secure the span crawler to a cable plant.

FIG. 9A is a side view of another example of a span crawler 900A that is similar to the span crawler 500 of FIG. 5 and the span crawler 800 of FIG. 7, FIG. 8A, and FIG. 8B, except that instead of the second roller or rollers 708 (FIG. 7), the span crawler is secured to the cable plant 102 via a pivoting arm, in accordance with an embodiment of the invention. Components common to FIG. 5, FIG. 7, FIG. 8A, and FIG. 8B that are not discussed with respect to FIG. 9A, are not numbered in FIG. 9A. The span crawler 900A includes a pivoting arm 902 to secure the span crawler to the cable plant 102. The pivoting arm 902 in this example has be an L-shaped arm including a first portion 904 and a second portion 906 transverse to the first arm. The pivoting arm 902 may also have other shapes. The pivoting arm 902 pivots about a pivot point 908 on the carriage 910. In one example, the pivot point 908 may be a rod extending from the side of the carriage 910, while pivoting arm 902 may have a collar that rotates around the rod, for example. A second pivoting arm may also be similarly coupled to the opposite side of the carriage, which is not shown in this view.

The pivoting arm 902 has a first position away from the cable plant 102. An example of a first position is shown in solid line in FIG. 9A. The pivoting arm 902 also has a second position, shown in phantom, where the pivoting arm is rotated about the pivot point 908 so that the first portion 904 is close to or in contact with a lower portion of the cable plant 102 and the second arm 906 is close to or in contact with an outer side of the cable plant. As with the first lower roller 814 discussed above, the second portion 906 may be within about 3 inches of the cable plant 102, such as within 2 inches or within 1 inch of the cable plant, for example. In this example, when in the second position, the first portion 904 is in a horizontal position and the second arm 906 is perpendicular to the first arm. Through holes through the rod and the collar may be positioned so that they are aligned when the pivoting arm is in the second position. The pivoting arm 902 may then be locked into position by a cotter pin or a split pin 914 inserted through aligned openings in the collar and the rod, for example.

Figure 9B:
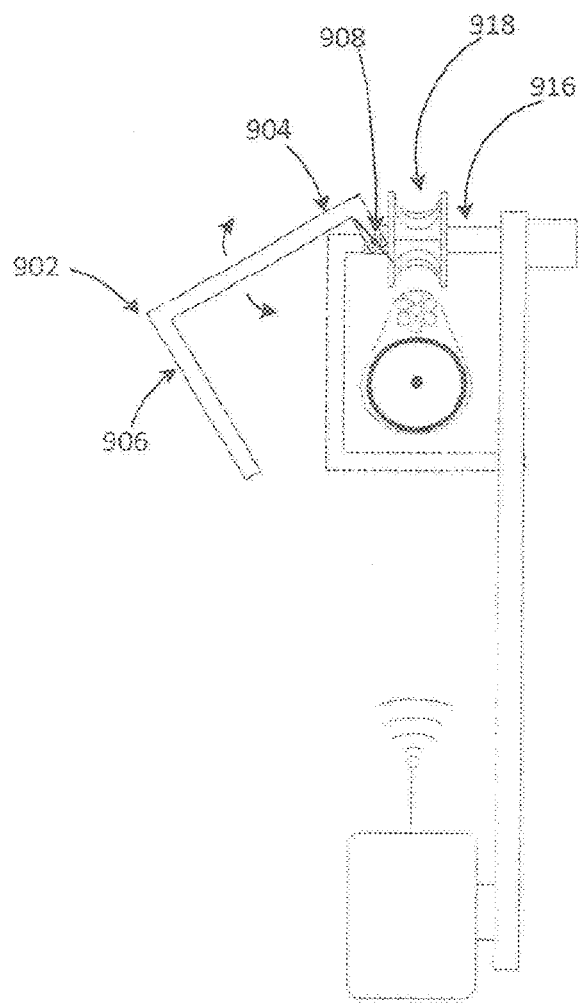
FIG. 9B is a side view of an additional example of a span crawler, in accordance with an embodiment of the invention, including a pivot arm to secure the span crawler to a cable plant.

FIG. 9B is a side view of another example of a span crawler 900B that is similar to the span crawler 900A of FIG. 9A. Components common to FIG. 9A are commonly numbered. Components common to FIG. 5, FIG. 7, FIG. 8A, and FIG. 8B that are not discussed with respect to FIG. 9B are not numbered in FIG. 9B. In the example of FIG. 9B, the pivoting arm 902 is coupled to a pivot point 908 that is located on a portion of the axle or rod 916 that extends through the first upper roller 918. The pivoting arm 902 in this example is an L-shaped arm including a first portion 904 and a second portion 906 transverse to the first arm, as in FIG. 9A. The pivoting arm 902 may also have other shapes. The pivot point 908 may be a rod extending through the axle or rod 916, while the pivoting arm 902 may have a collar that rotates around the rod, as in FIG. 9A, for example. A second pivoting arm may also be similarly coupled to an axle or rod extending through a second upper roller behind the first upper roller, which are not shown in this view. The pivoting arm 902 has a first position away from the cable plant 102, shown in solid line in FIG. 9A, and a second position, shown in phantom. In the second position, the pivoting arm 902 is rotated about the pivot point 908 so that the second portion 906 is close to or in contact with a lower portion of the cable plant 102 and the first portion 904 is close to or in contact with an outer side of the cable plant. As in FIG. 9A, discussed above, the second portion 906 may be within about 3 inches of the cable plant 102, such as within 2 inches or within 1 inch of the cable plant, for example. Through holes through the rod and the collar may be positioned so that they are aligned when the pivoting arm is in the second position. The pivoting arm 902 may then be locked into position by a cotter pin or a split pin 914 inserted through aligned openings in the collar and the rod, for example.

Figure 10:
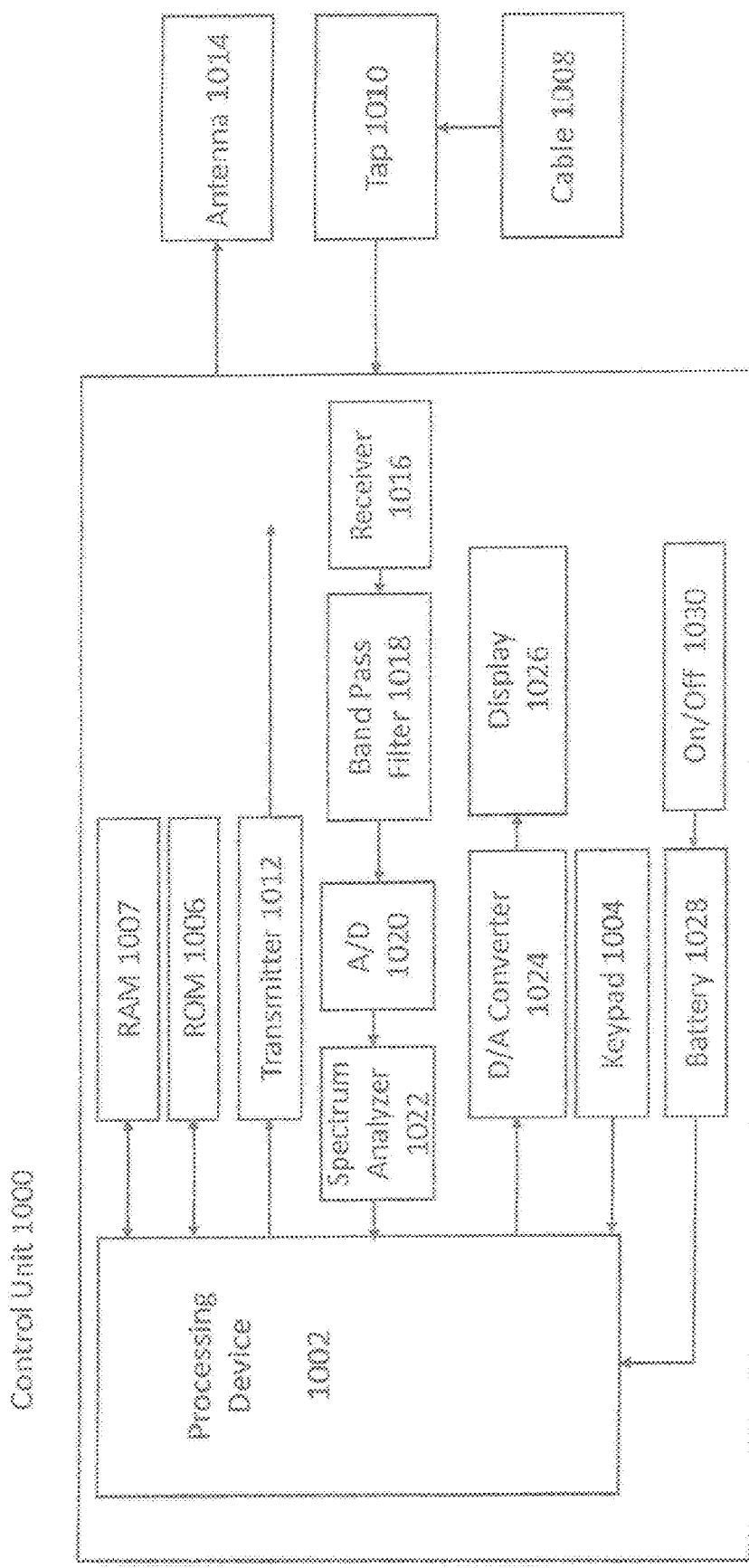
FIG. 10 is a block diagram of an example of a control device that controls operation of a span crawler, in accordance with an embodiment of the invention.

FIG. 10 is a block diagram of an example of a control device 1000 that controls operation of a span crawler, in accordance with an embodiment of the invention. The control device 1000 provides control signals to the span crawler to control the operation of the motors (on/off, rotate clockwise/counterclockwise) and the transmitter (turn transmitter on/off), which controls the signals emitted by the antenna. The control unit 1000 includes a processing device 1002 controlled by inputs provided by a user via a keypad 1004 and/or in accordance with software stored in ROM 1006, for example. The processing device 1002 may be a microprocessor, a microcontroller, or another such control device or circuit, for example. RAM 1007 is also provided to store information received from monitoring the signals carried by the cable 1008 via the tap 1010, for example, such as amplitudes of frequencies, for example, as discussed below. At least certain of the components of the control device 1000 may be on one or more printed circuit boards (PCBs), for example.

A wireless transmitter 1012 is provided for wirelessly sending control signals to the span crawler. The processing device 1002 sends digital control signals to the transmitter 1012, which converts the digital signals into analog signals for transmission by an antenna 1014. A digital-to-analog converter may be provided between the processing device 1002 and the transmitter 1012 to convert the digital signals to analog signals, for example. In one example, the transmitter 1012 may be configured to generate and transmit RF signals in one of the eighty (80) channels defined by 47 CFR Part 95, Radio Control Radio Service, between 72.0 MHz and 76.0 MHz. Each channel is 8 kHz wide. The transmitter may be configured to generate and transmit RF signals having a frequency centered at 72.0 MHz, +/−4 kHz for example. It is noted that the additional six (6) channels defined by 47 CFR Part 95, Radio Control Radio Service in the range of 26.995 MHz to 27.255 MHz could, in an example discussed below interfere with the signals injected by the span crawler and would not, therefore, be used. If a different RF frequency is injected by the span crawler, then the transmitter 1012 could be configured to generate and transmit RF signals in one of those six (6) channels. Other frequencies and frequency bands may be used, as well.

A receiver 1016 is provided for receiving RF signals from the cable 1008 via the tap 1010. In this example, analog signals received by the receiver 1016 are provided to an optional band pass filter 1018 to remove the signals carried by the cable 1008 in normal operation, such as cable programming signals, for example. This facilitates detection of the RF signal emitted by the span crawler. If the band pass filter 1018 is not provided, then detection may be facilitated by emitting an RF signal with a characteristic having a greater difference from the characteristics of the signals carried by the cable, 1008, such as a much higher amplitude and/or higher/lower frequency than if the band pass filter 1018 is included, as discussed above.

A receiver 1016 is provided for receiving RF signals from the cable 1008 via the tap 1010. In this example, analog signals received by the receiver 1016 are provided to an optional band pass filter 1018 to remove the signals carried by the cable 1008 in normal operation, such as cable programming signals, for example. This facilitates detection of the RF signal emitted by the span crawler. If the band pass filter 1018 is not provided, then detection may be facilitated by emitting an RF signal with a characteristic having a greater difference from the characteristics of the signals carried by the cable, 1008, such as a much higher amplitude and/or higher or lower frequency than if the band pass filter 1018 is included, as discussed above.

The filtered signal in this example is provided to an analog-to-digital converter 1020. The resulting digital signal is provided to a spectrum analyzer 1022. Alternatively, the resulting digital signal may be provided to another device for signal analysis, such as a signal level meter, for example. The analyzed signals are provided to the processing device 1002, which further analyze the signals and configure the signals for display. The processing device 1002 outputs digital signals based on the received signals, which may be converted to analog signals for display by a digital-to-analog converter 1024. The analog signals are displayed on the display 1026. A battery 1028 is provided in this example to provide power to the components of the control device 1000. An On/Off button 1030 is provided in the casing of the control device 1000 to turn the control device On and Off. If the processing device 1000 is programmed to operate automatically, the On/Off button 1030 may also be used to start automatic operation of the control device 1000, as discussed further below.

FIG. 11 is a block diagram of an example of a span crawler control device 1100 that is located on the span crawler and receives control signals from the control unit 1000 of FIG. 10, for example, to control operation of the motors 1102, transmitter 1104, and antenna 1106 of the span crawler, as discussed herein. The span crawler control 1100 receives the control signals via a receiver 1108, such as a wireless receiver, for example. If the received signals are analog signals, an analog-to-digital converter 1110 is provided to convert the received control signals to digital signals, which are then provided to a processing device 1112. Based on the control signals, the processing device 1112 controls the one or more motors 1102 along line 1114 and the transmitter 1104 along line 1116, which may be a wires or conductive strips. Alternatively, either or both lines 114, 1116 may represent wireless connections. In this case, one or more transmitters would be provided in the span crawler control 1100 and receivers would be provided on the motors 1102 and/or transmitter 1104.

The transmitter 1104 causes the antenna 1106 to emit RF signals to identify an ingress point, as discussed above. In one example, the transmitter 1104 is configured to generate and transmit RF signals in any of the forty (40) channels in the range of 26.965 MHz to 27.405 MHz defined by 47 CFR Part 95, Citizens Band Radio Service, except for Channel 9 (27.065 MHz), which is reserved for emergency communications. The forty (40) channels are ten (10) kHz wide. In one example, the transmitter 1104 is configured to generate and transmit RF signals having a frequency centered at 27.125 MHz+/−5 kHz. Other frequencies and frequency bands may be used, as well.

A memory 1118 may be provided, if necessary. The memory 1118 may store software for controlling the operation of the span crawler, for example. The processing device 1112 may be a microprocessor, a microcontroller, or another such control device or circuit, for example. A battery 1120 is provided in this example to provide power to the components of the span crawler 1100, including the motor(s) 1102, the transmitter 1104, and the processing device 1112.

Figure 12A:
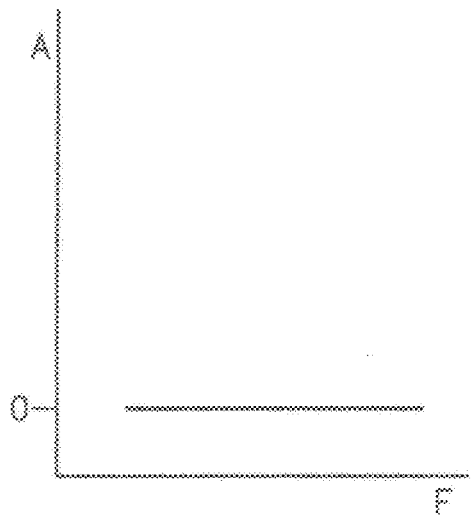
FIGS. 12A-12D are examples of outputs of the spectrum analyzer of FIG. 10 on the display of the control unit in FIG. 4, as the span crawler moves across a cable plant including a defect, such as a radial defect, during operation.

FIG. 12A-12D are examples of outputs of the spectrum analyzer 1022 of FIG. 10 on the display 418 of the control unit 404 in FIG. 4, as the span crawler 410 (or the span crawler 700 of FIG. 7) moves across a cable plant 102 including a defect, such as a radial defect, during operation. The X-axis is a Frequency F of the detected signal, and the Y-axis is the amplitude A of the detected signal. In this example, the RF cable signals normally carried by the cable have been filtered by a band pass filter 1018, as discussed above with respect to FIG. 10. In FIG. 12A, the span crawler is so far from the defect that not enough of the RF signals emitted by the span crawler enter the cable through the defect to be detected. In one example, if the span crawler is over about 50 feet from the defect, then the emitted RF signal will not be detected. The detected filtered signal line 1202 is therefore at a baseline or at zero (0), as shown in FIG. 12A, for example.

Figure 12B:
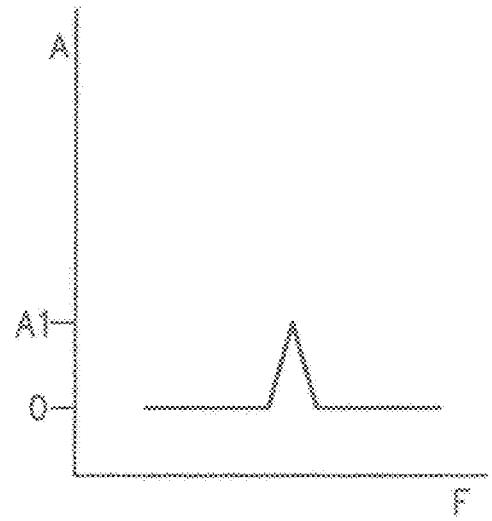

FIG. 12B is an example of the output of the spectrum analyzer 1022 on the display 418 when the span crawler 410, 700 is close enough to the defect for some of the emitted RF signals to be injected into the cable 114 through the defect. An increasing amount of RF signals enters the cable, as indicated by the rising portion of the line 1204. A low amplitude signal A1 is detected at the frequency band of the injected signal.

Figure 12C:
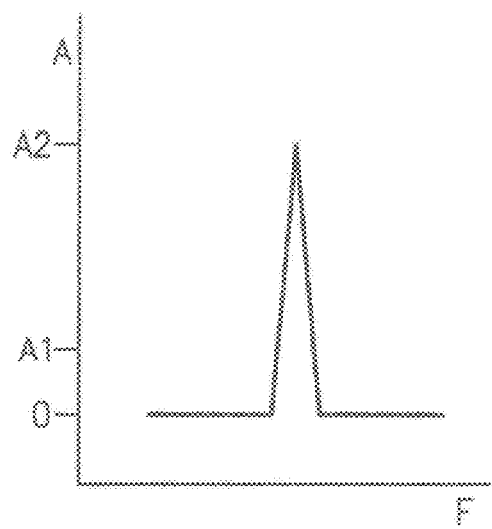

FIG. 12C is an example of the output of the spectrum analyzer 1022 on the display 418 when the span crawler 410, 700 is close to or at the location of the defect. A high amplitude signal A2 is detected that is greater than A1, at the frequency band of the injected signal. If the span crawler 410, 700 is at the location of the defect, then the detected amplitude will be a peak amplitude.

Figure 12D:
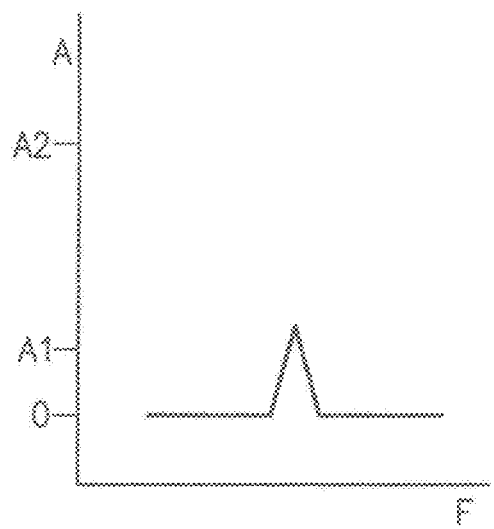

FIG. 12D is an example of the output of the spectrum analyzer 1022 on the display 418 when the span crawler 410, 700 has passed the location of the defect. Since the span crawler 410, 700 is farther from the defect, less of the emitted RF signal is injected into the cable 114 through the defect. A lower amplitude signal is therefore detected than the detected signal in FIG. 12C. In this example, the detected signal is again A1 because the span crawler 410, 700 is at about the same distance beyond the defect that the span crawler was in front of the defect when the signal was detected in FIG. 12B. As the span crawler 410, 700 continues farther past the defect, the output of the spectrum analyzer 1022 on the display 418 may return to zero (0), as in FIG. 12A.

In one example, the user may visually identify the approximate location of the defect based on the location of the span crawler 410, 700 on the cable plant 102 when a peak or near peak amplitude A2 is detected and displayed. The near peak may be within 10% to 30% of the peak amplitude, for example, such as between 10% to 20%, for example. The user would then examine the cable 114 in the visually identified area of the span crawler 410, 700 to locate the defect or loose component and repair the defect, in a manner known in the art. The user may stop the span crawler 410, 700 when the peak or near peak is located and go to the location of the span crawler to find the defect. Alternatively, the user may note the approximate location of the defect and continue the traversal of the cable plant 102 with the span crawler 410, 700 to locate other defects before proceeding to repair the defect or defects in the cable.

In another example, when the user notices on the display the decrease in the detected amplitude A (that a peak A is passed and the amplitude is decreasing), the user may reverse the direction of the span crawler 410, 700 to more precisely locate the defect. The user may reverse the direction when the detected amplitude is observed to drop from about 10% to about 20% from the peak amplitude, for example.

The example of FIGS. 12A-12D is described with respect to a user visually observing the display and controlling the movement of the span crawler. In another example, the analysis of the received signal and control of the movement of the span crawler may be performed automatically under the control of the processing device 1002 of the control unit of FIG. 10, for example, or by the processing device 1112 of the span crawler control 1100 of FIG. 11. The software controlling operation of the respective processing device 1002, 1112, may analyze the detected signals, store detected amplitudes, such as in the RAM 1007 and/or the memory 1118, for example, and compare a current detected amplitude to prior detected amplitudes, for example.

The software may cause the span crawler to stop or may cause the span crawler to reverse when a current detected amplitude is less than the highest prior detected amplitude. The difference between a current detected amplitude and the highest prior detected amplitude may be greater than a threshold before the highest prior detected amplitude is considered to be a peak amplitude. The threshold may be 5% or 10% or may be in a range of from 5% to about 10%, for example. Other thresholds and threshold ranges may be used. Amplitudes may be detected at predetermined time intervals, such as from about every 1 second to about every 60 seconds after the span crawler 410, 700 starts to emit RF signals, for example. The prior detected amplitude may be detected 1 second, 5 seconds, 10 seconds earlier, 30 seconds earlier, or 60 seconds earlier, for example. In another example, one of the processing devices 1002, 1112 may analyze the detected signals and provide notice to the user when the change in the detected characteristic is from about 5% to about 10%, for example. As discussed above, other characteristics of the detected signals may be used besides the amplitude of the frequency. Automatic analysis of the signals allows for more detection of smaller differences than would visual analysis.

Figure 13:
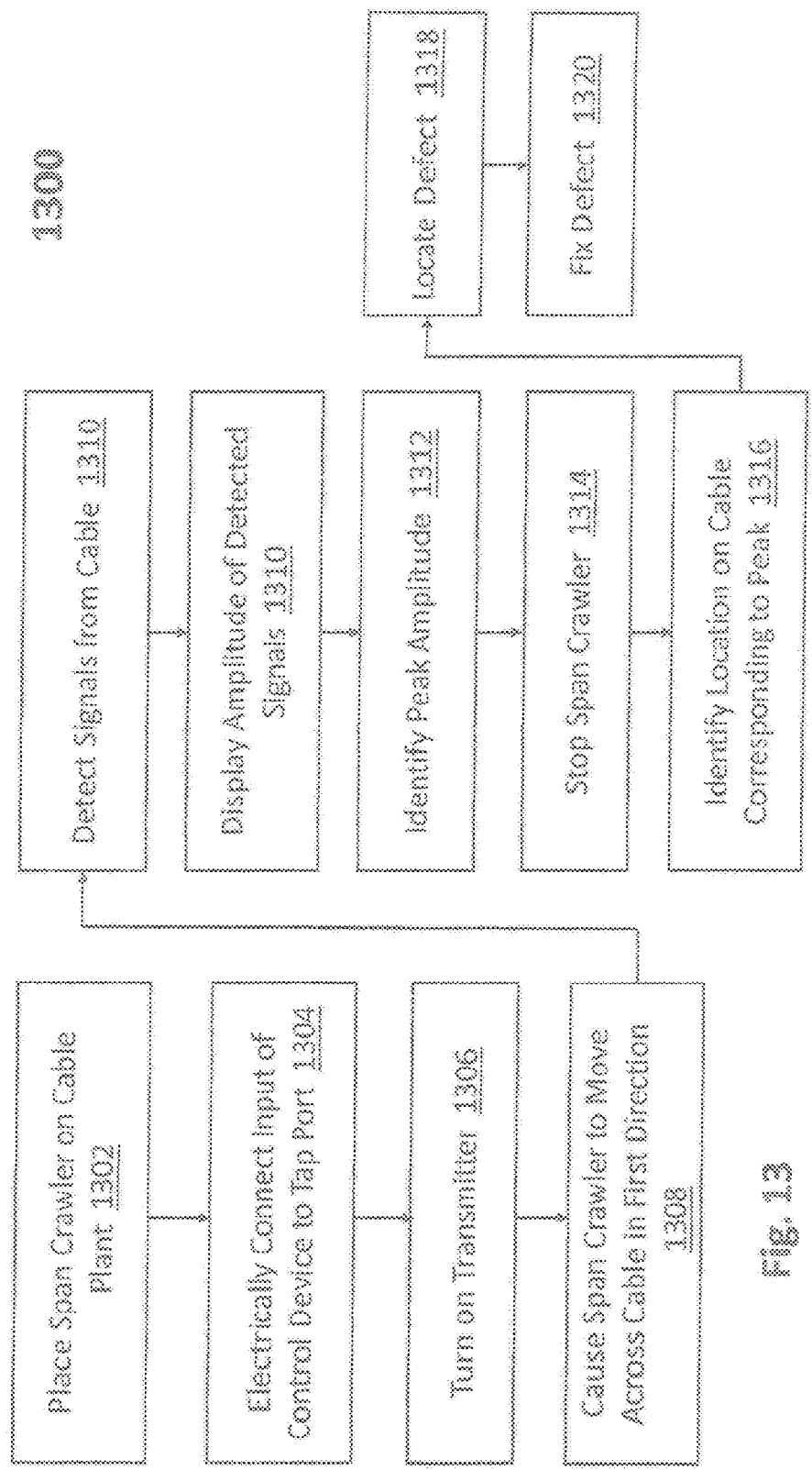
FIG. 13 is a flowchart of an example of a method for operating a span crawler, in accordance with an embodiment of the invention.

FIG. 13 is a flowchart of an example of a method 1300 for operating a span crawler, such as the span crawler 410, 700, in accordance with an embodiment of the invention. In this embodiment of the invention, the operation of the span crawler is controlled by a user, via a control device, such as the control device 404, 1000. The order of the blocks in the method 1300 may be varied. In this example, the span crawler 410, 700 is placed on the cable plant 102, in block 1302, and the control device 404, 1000 is electrically connected to the cable 114, such as through a tap port 121 of the tap 120, 1010, by a user.

After turning on the span crawler 410. 700 via the On/Off button 1120 and turning on the control device 404, 1000 via the On/Off button 1030, for example, the user turns on the transmitter 412, 514, 710 of the span crawler 410, 700, via the control device 404, 1000, in block 1306. The user causes the span crawler to move across the cable plant 102 in a first direction, in block 1308, via the control device 494, 700, in block 1308, by causing rotation of the one or more first rollers 408, 502, 704, 802, 838 on the span crawler.

Signals received from the cable 114 are detected by the control device 404, 700, via the receiver 1016, in block 1310, and are displayed by the processing device 1002 of the control device on the display 418, 1026, in block 1310. The user visually identifies a peak or near peak amplitude by observing the amplitude of the displayed signal rise and start to fall, in block 1312. A visual observation of a decrease in amplitude of from about 20% to about 30% is sufficient to visually identify a peak in this example.

When the peak is identified on the display 1026, the span crawler may be stopped, in block 1314. The location on the cable 114 corresponding to the peak in amplitude may be approximately located by the user, in block 1316. The direction of the span crawler 410, 700 may be reversed by the user, via the control device 404, 700, to better identify the location corresponding to the peak, if desired. The area of the cable 114 that resulted in the peak may be physically examined by a user to locate the defect, in a manner known in the art, in block. 1318. The defect may then be repaired, in block 1320, also in a manner known in the art.

FIG. 14 is a flowchart of an example of a method 1400 for operation of a span crawler, such as the span crawler 410, 700, in accordance with an embodiment of the invention. In this embodiment of the invention, the operation of the span crawler is automatically controlled by the processing device 1002 of the control device 1000, for example, in accordance with a program stored in the ROM 1006, for example. As in FIG. 13, the order of the blocks in the method 1400 may be varied. The method 1400 will be described with respect to common blocks in FIG. 13.

In this example, the method 1400 starts with performance of blocks 1302-1304 of FIG. 13 by a user. The user then activates the span crawler 410, 700 to start operation, such as by turning on an "On/Off" button 1030 on the control device 404, 1000, for example. The control device then automatically turns on the transmitter, in block 1306, causes the span crawler 410, 700 to move across the cable in a first direction, in block 1308, and detects signals from the cable 114, in block 1310. The method then proceeds to the method 1400 of FIG. 14.

Amplitudes of detected signals are stored, such as in the RAM 1007, in block 1402. The amplitude of a current detected signal is compared to prior detected amplitudes stored in the RAM 1007, by the processing device 1002, in block 1406. It is then determined whether the amplitude of a current detected signal is less than the highest prior detected amplitude, in block 1406. If not (No in block 1406), then blocks 1404 and 1406 are repeated until it is determined that the amplitude of a current detected signal is less than the highest prior detected amplitude (Yes in block 1406). Block 1406 may determine whether the amplitude of a current detected signal is less than the highest prior detected amplitude by a predetermined amount, such as five (5) or ten (10) percent less, for example.

When the amplitude of a current detected signal is less than the highest prior detected amplitude or less by the predetermined amount (Yes in block 1406), the method 1400 returns to block 1314 of FIG. 13 to stop the span crawler, identify the location of the span crawler corresponding to the peak amplitude (in block 1316), locate the defect (in block 1318), and repair the defect (in block 1318), as discussed above.

Examples of implementations of embodiments of the invention are described above. Modifications may be made to those examples without departing from the scope of the invention, which is defined by the claims, below.

What is claimed is:

1. A method of identifying a signal ingress point in a cable including shielding around a conductor, the method comprising:
   moving an antenna along a span of the cable in a first direction by a carriage supported by the cable;
   emitting a radio-frequency signal toward the cable, by the antenna, while moving the antenna across the cable;
   monitoring the signals within the cable while moving the antenna across the cable; and
   determining whether there is a signal ingress point through the shielding based, at least in part, on whether the emitted radio-frequency signal is detected within the conductor.

2. The method of claim 1, wherein the antenna is supported by a carriage, the method comprising moving the antenna across the span by:
   moving the carriage across the cable by a motor driven roller.

3. The method of claim 1, comprising:
   monitoring the detected signals on a display on a control device coupled to a cable tap.

4. The method of claim 3, wherein monitoring the signals on the display comprises:
   identifying a peak or near peak in the displayed signal, wherein the peak or near peak is indicative of signal ingress in the cable proximate the location of the antenna.

5. The method of claim 4, comprising:
   automatically identifying the peak by a processing device.

6. The method of claim 5, comprising:
   automatically identifying a first received signal as a peak or near peak when a second received signal received after the first received signal has a characteristic different from the characteristic of the first received signal by at least a predetermined amount.

7. The method of claim 3, further comprising:
   filtering the signals by the control device to remove signals conveyed by the conductor in normal operation, and not removing the emitted signal.

8. The method of claim 1, further comprising:
   selectively controlling movement of the carriage across the cable in the first direction and in a second direction opposite to the first direction, via a control device.

9. The method of claim 8, further comprising:
   operating the control device by an operator; or
   operating the control device automatically based, at least in part, on the detected signal, by a processing device.

10. The method of claim 1, further comprising:
    if it is determined that there is a signal ingress point, repairing the signal ingress point.

11. The method of claim 1, wherein the signal ingress point comprises a defect in the shielding.

12. A system for identifying a signal ingress point in a cable, the system comprising:
    a self-propelled apparatus movable along a span of the cable, the apparatus comprising:
       an antenna configured to emit an RF signal toward the cable; and
    a control device to control operation of the self-propelled apparatus, the control device comprising:
       a transmitter to transmit control signals to the self-propelled apparatus;
       an electrical connector to be coupled to the cable;
       a receiver to receive signals from the cable, via the connector; and
       a display to display signals received from the cable, wherein the display of the emitted RF signal on the display is indicative of signal ingress in the cable proximate the location of the antenna with respect to the cable.

13. The system of claim 12, wherein the self-propelled apparatus further comprises:
    a carriage supporting the antenna;
    at least one roller coupled to the carriage; and
    at least one motor coupled to the at least one roller, the motor being configured to cause rotation of the at least one roller in at least a first direction, to cause movement of the self-propelled apparatus along the cable.

14. The system of claim 13, further comprising:
    at least one second roller coupled to the carriage below the at least one first roller, wherein the first roller is configured to sit on top of the cable and the position of the second roller on the carriage is adjustable to bring the second roller close to or into contact with a bottom of the cable.

15. The system of claim 12, further comprising:
    a pivoting arm coupled to the carriage, the pivoting arm having a first position rotated away from the cable and a second position rotated toward the cable when the apparatus is positioned on the cable, to secure the apparatus to the cable.

16. The system of claim 12, wherein:
    the apparatus or the control device further comprise a processing device configured to identify a first received signal as a peak or near peak signal when a second received signal received after the first received signal has a characteristic different from the characteristic of the first received signal by a predetermined amount; and
    the peak or near peak is indicative of signal ingress in the cable proximate the location of the antenna.

17. The system of claim 16, wherein the apparatus or the control device further comprises a processing device configured to filter the signals to remove signals conveyed by the cable in normal operation, and not remove the emitted signal.

18. The system of claim 12, wherein the cable includes shielding, and the signal ingress point comprises a defect in the shielding.

19. The system of claim 12, wherein the signal ingress point comprises a loose component of the cable.

20. An apparatus comprising:
a carriage;
a first roller attached to the carriage, the first roller being configured to sit on an upper surface of a cable plant including a cable, a strand, and a lashing wire lashing the cable to the strand;
a second roller attached to the carriage below the first roller, wherein the second roller is positioned on the carriage so that when the apparatus is placed on the cable plant, the second roller is positioned below the cable plant, the position of the second roller being adjustable so that after placement of the apparatus on the cable plant, the third second roller is positionable close to or in contact with a lower surface of the cable plant, to secure the apparatus to the cable plant;
a motor attached to the carriage, the motor being coupled to the first roller to cause rotation of the first roller in at least a first direction, to cause movement of the carriage across the cable plant in at least the first direction;
a transmitter attached to the carriage;
an antenna coupled to the transmitter, the antenna being configured to emit an RF signal under the control of the transmitter toward the cable plant when the carriage is placed on the cable plant; and
a processing device coupled to the motor and to the transmitter, the processing device configured to:
cause the motor to rotate in at least the first direction; and
control operation of the transmitter.

21. The apparatus of claim 20, wherein:
the carriage defines a groove through the carriage;
the second roller includes a rod perpendicular to a rotational axis of the roller, the rod protruding from the second roller, through the groove, the rod being moveable within the groove to adjust the position of the second roller; and
a connector for securing the second roller in position in the groove, close to or in contact with the lower surface of the cable when the apparatus is placed on the cable plant.

22. The method of claim 1, comprising:
moving the antenna along a bottom of the span of the cable by the carriage.

23. The system of claim 20, wherein:
the carriage extends longitudinally in a first direction; and
the first roller and the second roller are configured to move the carriage in a second direction perpendicular to the first direction, along the cable plant.

24. The apparatus of claim 23, wherein:
the first and second rollers are attached to a first portion of the carriage; and
the transmitter is attached to a second portion of the carriage opposite the first portion, the second portion being positioned below the cable plant when the carriage is placed on the cable plant such that the antenna is positioned below the cable plant when the carriage is placed on the cable plant.

* * * * *